(12) United States Patent
Hattori et al.

(10) Patent No.: US 10,418,183 B2
(45) Date of Patent: Sep. 17, 2019

(54) COMPOSITE ELECTRONIC COMPONENT AND RESISTOR DEVICE

(71) Applicant: Murata Manufacturing Co., Ltd., Nagaokakyo-shi, Kyoto-fu (JP)

(72) Inventors: Kazuo Hattori, Nagaokakyo (JP); Isamu Fujimoto, Nagaokakyo (JP); Shinichiro Kuroiwa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 12 days.

(21) Appl. No.: 15/697,509

(22) Filed: Sep. 7, 2017

(65) Prior Publication Data

US 2018/0075975 A1 Mar. 15, 2018

(30) Foreign Application Priority Data

Sep. 9, 2016 (JP) .................. 2016-176991

(51) Int. Cl.
*H01G 4/40* (2006.01)
*H01G 2/06* (2006.01)
(Continued)

(52) U.S. Cl.
CPC .............. *H01G 4/40* (2013.01); *H01G 2/065* (2013.01); *H01G 2/14* (2013.01); *H01G 4/232* (2013.01); *H01G 4/30* (2013.01); *H01G 4/385* (2013.01); *H05K 1/141* (2013.01); *H05K 3/28* (2013.01); *H05K 3/3436* (2013.01); *H01G 4/12* (2013.01); *H01L 21/84* (2013.01); *H05K 1/167* (2013.01); *H05K 2201/049* (2013.01); *H05K 2201/1006* (2013.01); *H05K 2201/10015* (2013.01); *H05K 2201/10515* (2013.01)

(58) Field of Classification Search
CPC .................................. H01G 4/30; H01G 4/40
See application file for complete search history.

(56) References Cited

U.S. PATENT DOCUMENTS

2012/0236462 A1 9/2012 Haruki et al.
2015/0054388 A1* 2/2015 Itagaki .................. H01C 7/008
310/364

(Continued)

FOREIGN PATENT DOCUMENTS

CN 106340362 A 1/2017
JP 6-283301 A 10/1994
(Continued)

OTHER PUBLICATIONS

Official Communication issued in corresponding Korean Patent Application No. 10-2017-0113249, dated Jun. 21, 2018.
(Continued)

*Primary Examiner* — Eric W Thomas
(74) *Attorney, Agent, or Firm* — Keating & Bennett, LLP

(57) ABSTRACT

A composite electronic component includes a capacitor device and a resistor device stacked together in a height direction. The capacitor device includes a capacitor body and first and second external electrodes. The resistor device includes a base, a resistive element, first and second upper surface conductors, first and second lower surface conductors, a first connection conductor, and a second connection conductor. The upper surface of the base of the resistor device faces the lower surface of the capacitor body of the capacitor device, the first upper surface conductor is electrically connected to the first external electrode, and the second upper surface conductor is electrically connected to the second external electrode.

29 Claims, 30 Drawing Sheets

(51) Int. Cl.
    *H01G 4/30*     (2006.01)
    *H01G 4/38*     (2006.01)
    *H01G 2/14*     (2006.01)
    *H01G 4/232*     (2006.01)
    *H05K 1/14*     (2006.01)
    *H05K 3/28*     (2006.01)
    *H05K 3/34*     (2006.01)
    *H01L 21/84*     (2006.01)
    *H01G 4/12*     (2006.01)
    *H05K 1/16*     (2006.01)

(56) References Cited

U.S. PATENT DOCUMENTS

| | | |
|---|---|---|
| 2016/0133386 A1 | 5/2016 | Park et al. |
| 2016/0205769 A1* | 7/2016 | Park .................. H01G 4/224 174/260 |
| 2017/0013718 A1 | 1/2017 | Hattori et al. |

FOREIGN PATENT DOCUMENTS

| | | |
|---|---|---|
| JP | 08-064458 A | 3/1996 |
| JP | 08-330174 A | 12/1996 |
| JP | 2000-164456 A | 6/2000 |
| JP | 2001-338838 A | 12/2001 |
| JP | 2014-187315 A | 10/2014 |
| KR | 10-2010-0048044 A | 5/2010 |
| KR | 10-2012-0106599 A | 9/2012 |
| KR | 10-2016-0055424 A | 5/2016 |

OTHER PUBLICATIONS

Official Communication issued in Korean Patent Application No. 10-2017-0113249, dated Dec. 28, 2018.

Hattori, K. et al.; "Composite Electronic Component and Resistor Device"; U.S. Appl. No. 15/697,503, filed Sep. 7, 2017.

* cited by examiner

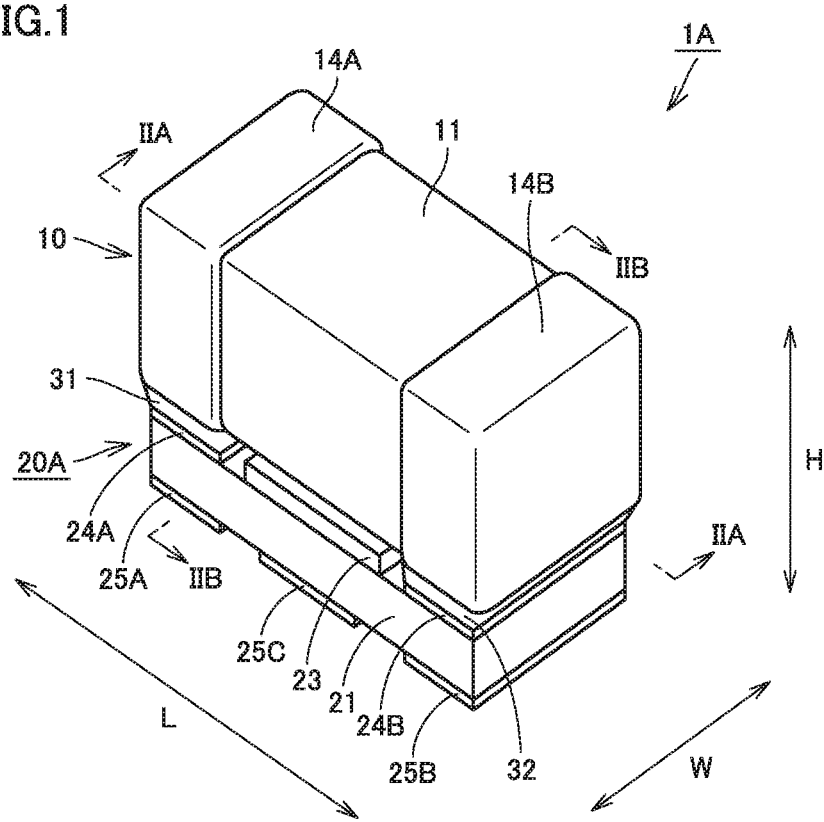

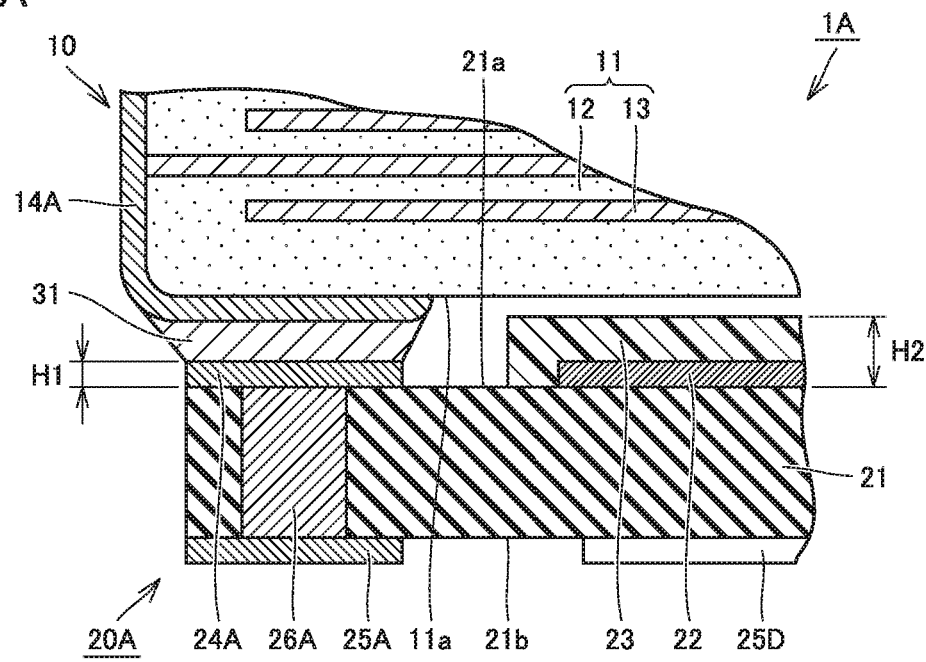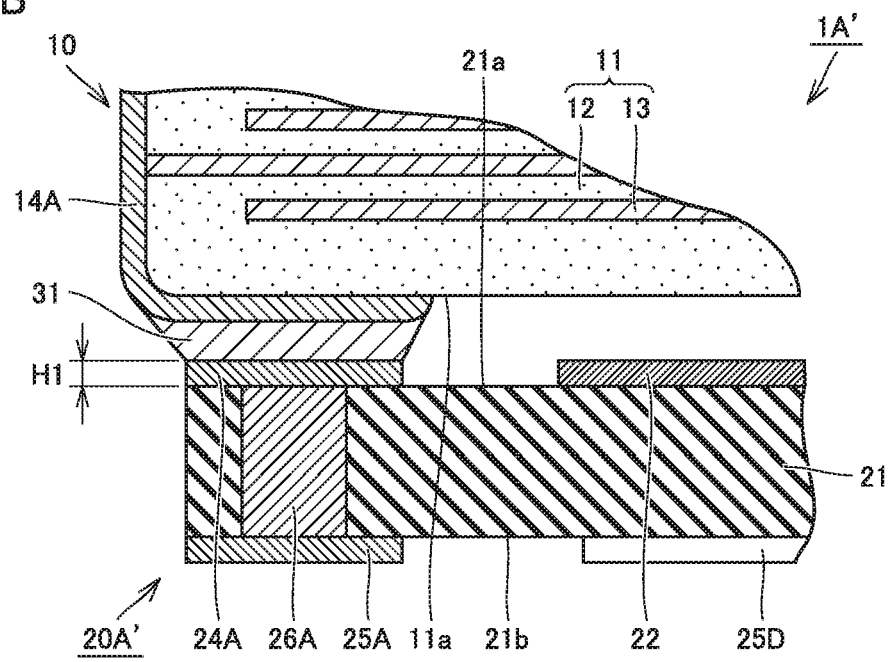

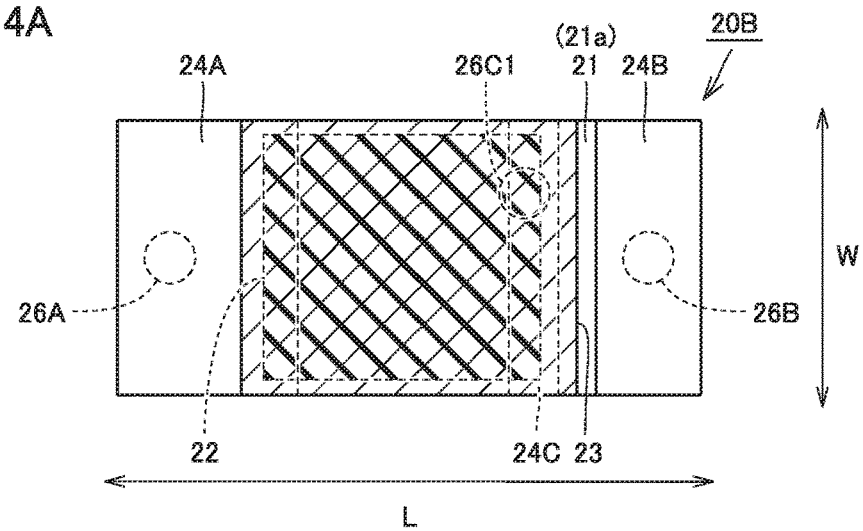
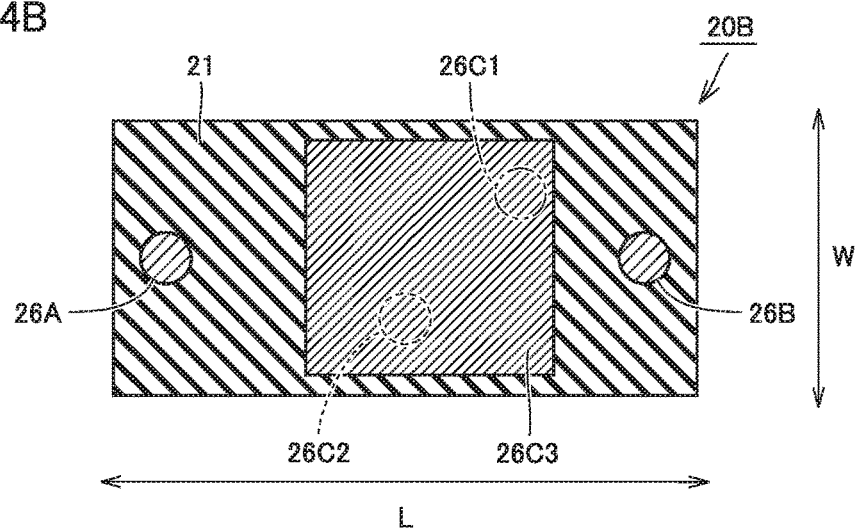
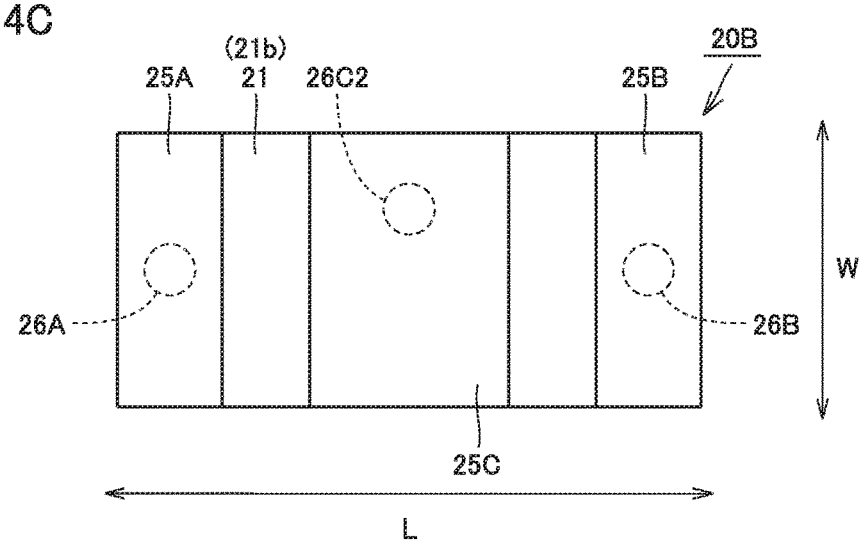

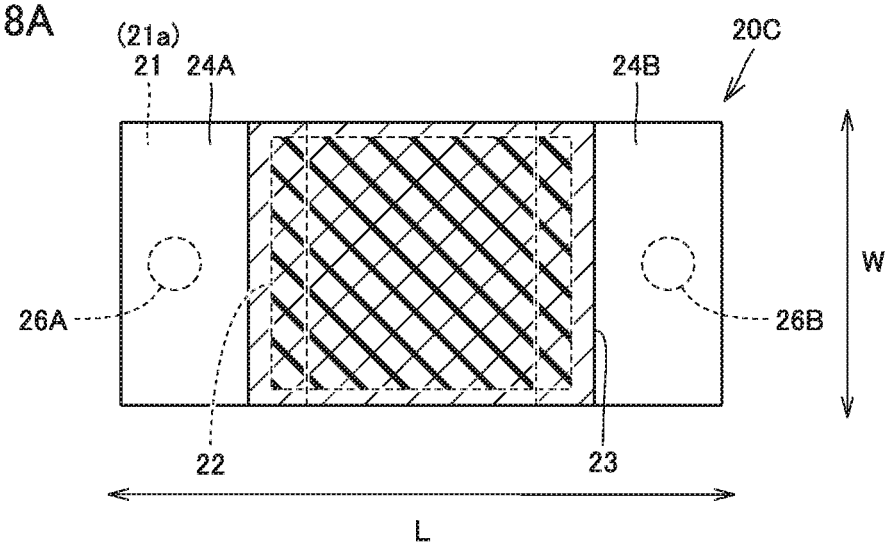
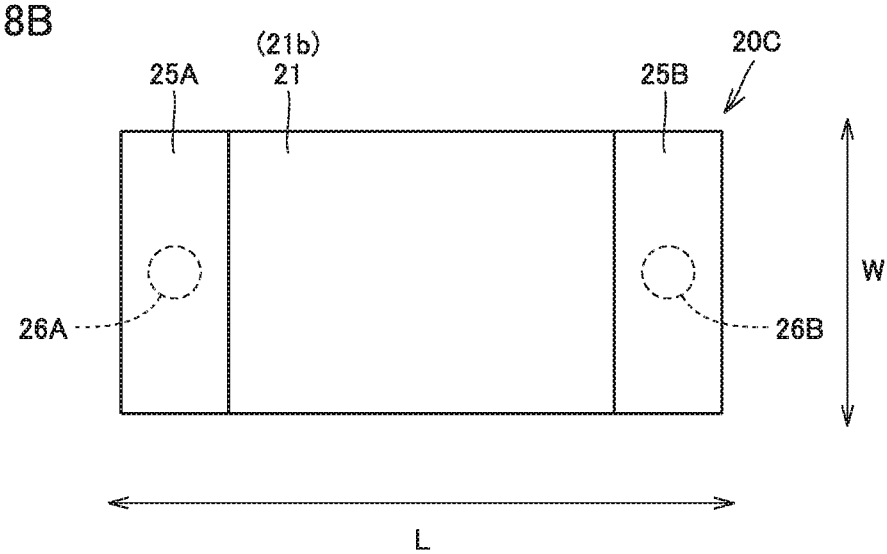
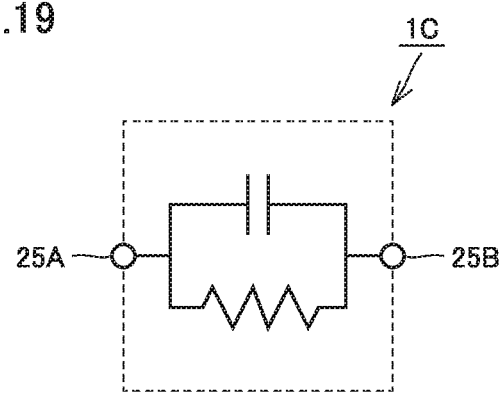

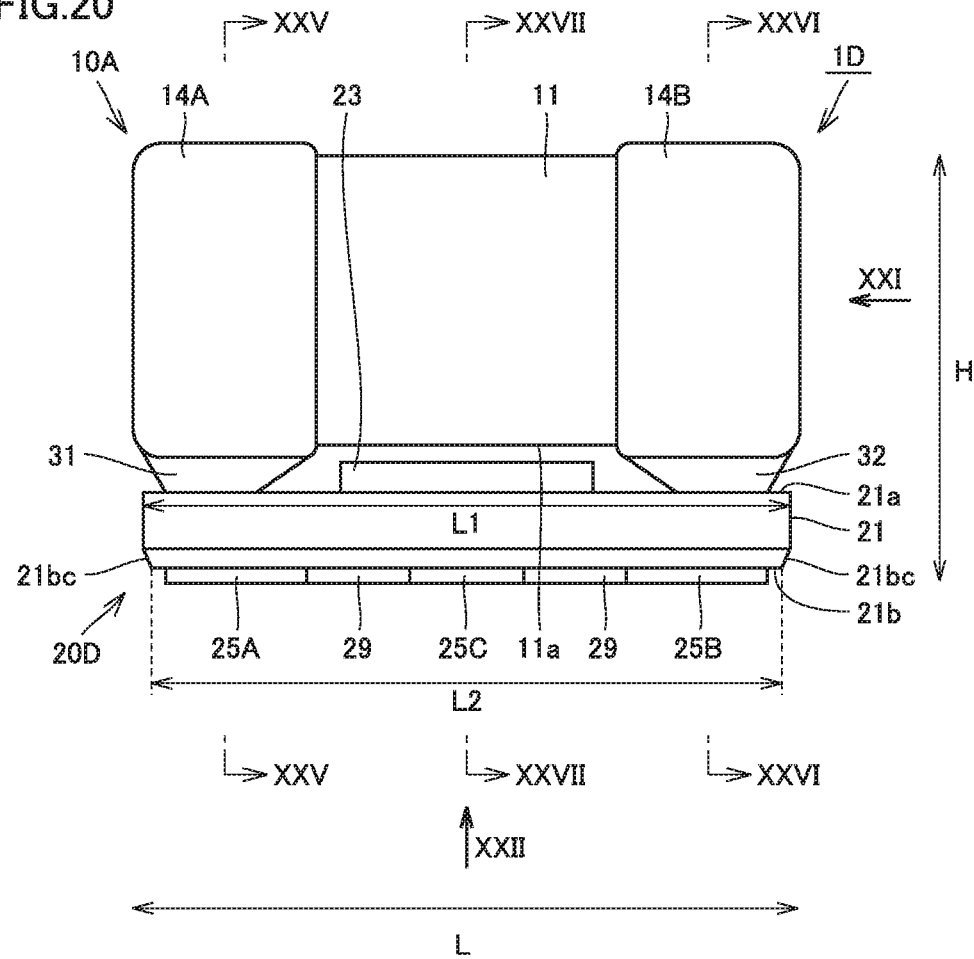

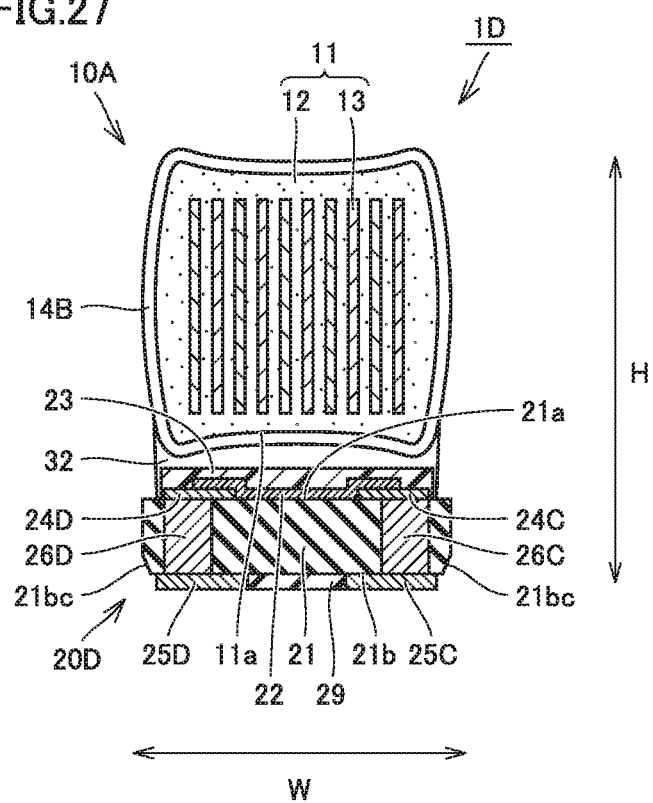

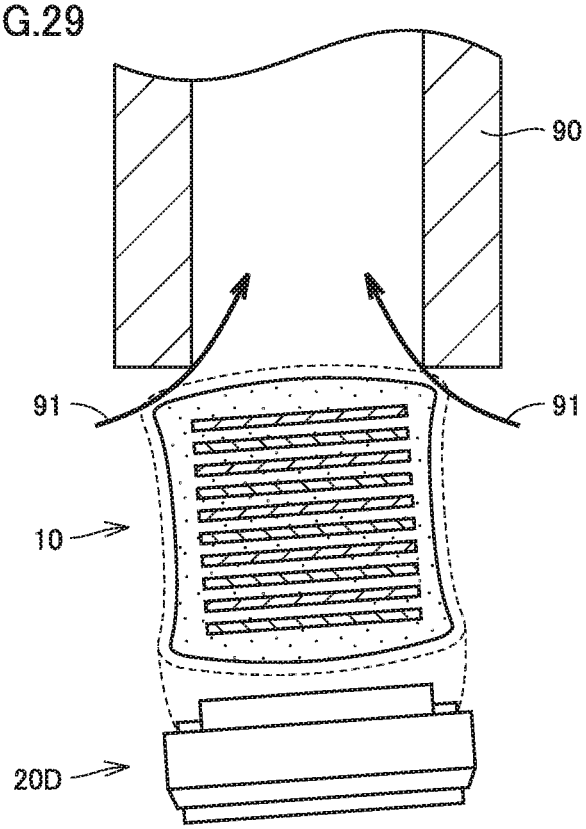

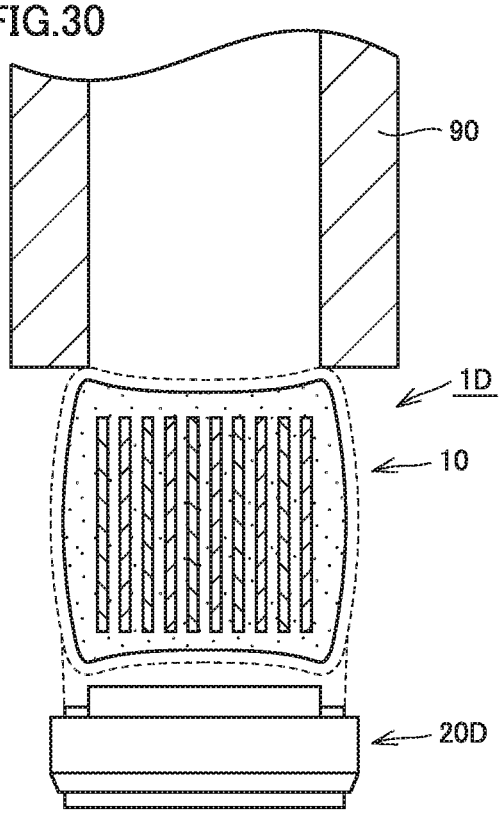

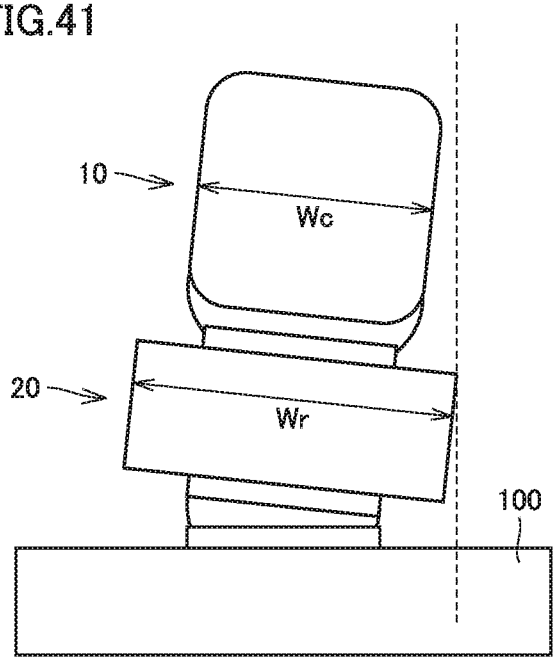

COMPOSITE ELECTRONIC COMPONENT AND RESISTOR DEVICE

CROSS REFERENCE TO RELATED APPLICATIONS

This application claims the benefit of priority to Japanese Patent Application No. 2016-176991 filed on Sep. 9, 2016. The entire contents of this application are hereby incorporated herein by reference.

BACKGROUND OF THE INVENTION

1. Field of the Invention

The present invention relates to a composite electronic component including a resistor device and a capacitor device, and also relates to a resistor device included in an composite electronic component and structured to be used for the composite electronic component.

2. Description of the Related Art

A variety of composite electronic components have been proposed each including a resistor element (R) and a capacitor element (C) for achieving a higher degree of integration of electronic elements disposed on a circuit board.

For example, Japanese Patent Laying-Open No. 2001-338838 discloses a composite electronic component including a chip capacitor that includes a capacitor body and a resistive element disposed on an external surface of the capacitor body, and the resistive element is connected to a pair of external electrodes disposed on the external surface of the capacitor body so that the resistor element and the capacitor element are electrically connected to each other.

Japanese Patent Laying-Open No. H06-283301 discloses a composite electronic component into which chip devices having a rectangular parallelepiped shape and identical in shape and dimensions are integrated. The chip devices are of two or more types selected from a group of chip resistors, chip thermistors, chip capacitors, and chip varistors, for example. In this composite electronic component, the chip devices are disposed on each other in the direction of the thickness of these devices, and a lead frame covers respective terminal electrodes of the devices together. The devices are thus integrated into the composite electronic component.

The composite electronic component disclosed in Japanese Patent Laying-Open No. 2001-338838 includes the resistive element provided directly on the surface of the capacitor body, which increases the difficulty in processing during manufacture. In addition, electrical characteristics of the resistive element are restricted by the size of the capacitor body as well as by the shape and the size, for example, of the pair of external electrodes disposed on the capacitor body. Consequently, the degree of freedom in designing the composite electronic component is significantly reduced.

As for the composite electronic component disclosed in Japanese Patent Laying-Open No. H06-283301, it is necessary to fabricate the different chip devices so as to be integrated, so that these chip devices are rectangular parallelepipeds that are identical in shape and dimensions. Due to this, electrical characteristics of each chip device are significantly restricted. Consequently, the degree of freedom in designing the composite electronic component is significantly reduced as well.

The composite electronic components disclosed in Japanese Patent Laying-Open Nos. 2001-338838 and H06-283301 are both limited to a configuration in which the resistor element (R) and the capacitor element (C) are electrically connected in parallel, due to the inherent structures of the composite electronic components. Consequently, the degree of freedom in designing a circuit is significantly limited. Use of these composite electronic components is therefore limited to a specific circuit.

SUMMARY OF THE INVENTION

Preferred embodiments of the present invention provide composite electronic components in which a resistor element and a capacitor element each having desired electrical characteristics are able to be easily combined, which improves the degree of freedom in designing the composite electronic component.

A composite electronic component according to a preferred embodiment of the present invention includes a resistor device, and a capacitor device mounted on the resistor device in a height direction. The resistor device includes an electrically insulating base including an upper surface and a lower surface opposite to each other in the height direction, a resistive element disposed on the base, a first upper surface conductor and a second upper surface conductor disposed on the upper surface of the base and separated from each other in a length direction perpendicular or substantially perpendicular to the height direction, a first lower surface conductor and a second lower surface conductor disposed on the lower surface of the base and separated from each other in the length direction, a first connection conductor connecting the first upper surface conductor to the first lower surface conductor, and a second connection conductor connecting the second upper surface conductor to the second lower surface conductor. The capacitor device includes a capacitor body including a lower surface crossing the height direction, and a first external electrode and a second external electrode disposed on an outer surface of the capacitor body and separated from each other in the length direction. In the composite electronic component according to this preferred embodiment, the upper surface of the base faces the lower surface of the capacitor body in the height direction, the first upper surface conductor is electrically connected to the first external electrode, and the second upper surface conductor is electrically connected to the second external electrode. The first connection conductor and the second connection conductor are each defined by only a conductor located inside the base.

In a composite electronic device according to another preferred embodiment of the present invention, the resistive element is disposed on the upper surface of the base and located between the first upper surface conductor and the second upper surface conductor in the length direction. In this case, the resistor device further includes a third upper surface conductor and a fourth upper surface conductor disposed on the upper surface of the base, located between the first upper surface conductor and the second upper surface conductor in the length direction, and separated from each other, a third lower surface conductor and a fourth lower surface conductor disposed on the lower surface of the base, located between the first lower surface conductor and the second lower surface conductor in the length direction, and separated from each other, a third connection conductor connecting the third upper surface conductor to the third lower surface conductor, and a fourth connection conductor connecting the fourth upper surface conductor to the fourth lower surface conductor. The third upper surface conductor and the fourth upper surface conductor may be connected to the resistive element. The third connection conductor and the fourth connection conductor are each defined by only a conductor located inside the base.

In a composite electronic device according to another preferred embodiment of the present invention, the third upper surface conductor and the fourth upper surface conductor may be separated from each other in a width direction perpendicular or substantially perpendicular to the height direction and to the length direction.

In a composite electronic device according to another preferred embodiment of the present invention, the third upper surface conductor and the fourth upper surface conductor may be separated from each other in the length direction.

In a composite electronic device according to another preferred embodiment of the present invention, at least one of the third connection conductor and the fourth connection conductor may include an inner connection conductor extending inside the base in a direction perpendicular or substantially perpendicular to the height direction, an upper via conductor connecting to the inner connection conductor, located between the upper surface of the base and the inner connection conductor, and extending in the height direction, and a lower via conductor connecting to the inner connection conductor, located between the lower surface of the base and the inner connection conductor, and extending in the height direction. In this case, the upper via conductor and the lower via conductor may not overlap each other at least partially, as seen in the height direction.

In a composite electronic device according to another preferred embodiment of the present invention, the resistive element is disposed on the upper surface of the base. In this case, the resistor device may further include a third upper surface conductor disposed on the upper surface of the base, and located between the first upper surface conductor and the second upper surface conductor in the length direction, a third lower surface conductor disposed on the lower surface of the base, and located between the first lower surface conductor and the second lower surface conductor in the length direction, and a third connection conductor connecting the third upper surface conductor to the third lower surface conductor. The first upper surface conductor and the third upper surface conductor may be connected to the resistive element. The third connection conductor is defined by only a conductor located inside the base.

In a composite electronic device according to another preferred embodiment of the present invention, the third connection conductor may include an inner connection conductor extending inside the base in a direction perpendicular or substantially perpendicular to the height direction, an upper via conductor connecting to the inner connection conductor, located between the upper surface of the base and the inner connection conductor, and extending in the height direction, and a lower via conductor connecting to the inner connection conductor, located between the lower surface of the base and the inner connection conductor, and extending in the height direction. In this case, the upper via conductor and the lower via conductor may not overlap each other at least partially, as seen in the height direction.

In a composite electronic device according to another preferred embodiment of the present invention, the resistive element is disposed on the upper surface of the base. In this case, the first upper surface conductor and the second upper surface conductor may be connected to the resistive element.

In a composite electronic device according to another preferred embodiment of the present invention, the resistor device further includes a protective film covering the resistive element.

In a composite electronic device according to another preferred embodiment of the present invention, a maximum height of the protective film from the upper surface of the base may be larger than respective maximum heights of the first upper surface conductor and the second upper surface conductor from the upper surface of the base.

In a composite electronic device according to another preferred embodiment of the present invention, the resistive element is disposed on the lower surface of the base and located between the first lower surface conductor and the second lower surface conductor in the length direction. In this case, the resistor device may further include a third lower surface conductor and a fourth lower surface conductor disposed on the lower surface of the base, located between the first lower surface conductor and the second lower surface conductor in the length direction, and separated from each other, and the third lower surface conductor and the fourth lower surface conductor may be connected to the resistive element.

In a composite electronic device according to another preferred embodiment of the present invention, the third lower surface conductor and the fourth lower surface conductor may be separated from each other in a width direction perpendicular or substantially perpendicular to the height direction and to the length direction.

In a composite electronic device according to another preferred embodiment of the present invention, the resistive element is disposed on the lower surface of the base. In this case, the resistor device may further include a third lower surface conductor disposed on the lower surface of the base and located between the first lower surface conductor and the second lower surface conductor in the length direction, and the first lower surface conductor and the third lower surface conductor may be connected to the resistive element.

In a composite electronic device according to another preferred embodiment of the present invention, the resistive element is disposed on the lower surface of the base. In this case, the first lower surface conductor and the second lower surface conductor may be connected to the resistive element.

In a composite electronic device according to another preferred embodiment of the present invention, the resistor device further includes a protective film covering the resistive element.

In a composite electronic device according to another preferred embodiment of the present invention, the resistive element is embedded in the base and located between the first connection conductor and the second connection conductor in the length direction. In this case, the resistor device may further include a first inner conductor and a second inner conductor embedded in the base, located between the first connection conductor and the second connection conductor in the length direction, and separated from each other, a third lower surface conductor and a fourth lower surface conductor disposed on the lower surface of the base, located between the first lower surface conductor and the second lower surface conductor in the length direction, and separated from each other, a third connection conductor connecting the first inner conductor to the third lower surface conductor, and a fourth connection conductor connecting the second inner conductor to the fourth lower surface conductor, and the first and second inner conductors may be connected to the resistive element. The third connection conductor and the fourth connection conductor are each defined by only a conductor located inside the base.

In a composite electronic device according to another preferred embodiment of the present invention, the first inner conductor and the second inner conductor may be separated from each other in a width direction perpendicular or substantially perpendicular to the height direction and to the length direction.

In a composite electronic device according to another preferred embodiment of the present invention, the first inner conductor and the second inner conductor may be separated from each other in the length direction.

In a composite electronic device according to another preferred embodiment of the present invention, the capacitor body includes a plurality of internal electrode layers stacked together. One of a pair of internal electrode layers adjacent to each other among the plurality of internal electrode layers is electrically connected to one of the first external electrode and the second external electrode and the other of the pair of internal electrode layers is electrically connected to the other of the first external electrode and the second external electrode. A stacking direction in which the plurality of internal electrode layers are stacked together is perpendicular or substantially perpendicular to the height direction.

In a composite electronic device according to another preferred embodiment of the present invention, the capacitor device includes surfaces crossing the stacking direction in which the plurality of internal electrode layers are stacked, as seen in the length direction, and the surfaces of the capacitor device are each curved outward in a convex shape.

In a composite electronic device according to another preferred embodiment of the present invention, the capacitor device includes surfaces extending along the stack direction in which the plurality of internal electrode layers are stacked, as seen in the length direction, and the surfaces of the capacitor device are each curved so that respective centers are recessed inward.

In a composite electronic device according to another preferred embodiment of the present invention, the first upper surface conductor and the first external electrode are connected to each other through a first joint member. The second upper surface conductor and the second external electrode are connected to each other through a second joint member.

In a composite electronic device according to another preferred embodiment of the present invention, the first joint member and the second joint member are each made of a conductive joint material.

In a composite electronic device according to another preferred embodiment of the present invention, a main component of the conductive joint material is Sn (tin).

In a composite electronic device according to another preferred embodiment of the present invention, the conductive joint material contains Sb (antimony) or Au (gold).

In a composite electronic device according to another preferred embodiment of the present invention, Ag (silver) and Cu (copper) are absent in the conductive joint material.

In a composite electronic device according to another preferred embodiment of the present invention, the conductive joint material has a melting point of about 237° C. or more.

In a composite electronic device according to another preferred embodiment of the present invention, a resin film extending continuously on the capacitor device and the resistor device covers at least a portion of a surface of each of the first joint member and the second joint member.

In a composite electronic device according to another preferred embodiment of the present invention, the resin film covers an entire surface of each of the first joint member and the second joint member.

In a composite electronic device according to another preferred embodiment of the present invention, the first external electrode and the second external electrode each include an Sn (tin) plating layer and an Sn—Ni (nickel) layer covered by the Sn plating layer and containing an intermetallic compound of Sn and Ni. The Sn—Ni layer is exposed from at least a portion of each of the first external electrode and the second external electrode.

In a composite electronic device according to another preferred embodiment of the present invention, the Sn—Ni layer is exposed from vertices and edges of each of the first external electrode and the second external electrode.

In a composite electronic device according to another preferred embodiment of the present invention, the first external electrode and the second external electrode are each smaller in width than the capacitor body.

In a composite electronic device according to another preferred embodiment of the present invention, the resistor device is larger in width than the capacitor device.

In a composite electronic device according to another preferred embodiment of the present invention, the resistor device is larger in length than the capacitor device.

In a composite electronic device according to another preferred embodiment of the present invention, the lower surface of the base is smaller in width than the upper surface of the base.

In a composite electronic device according to another preferred embodiment of the present invention, the lower surface of the base is smaller in length than the upper surface of the base.

A resistor device according to a preferred embodiment of the present invention includes an electrically insulating base including an upper surface and a lower surface opposite to each other in a height direction, a resistive element disposed on the base, a first upper surface conductor and a second upper surface conductor disposed on the upper surface of the base and separated from each other in a length direction perpendicular or substantially perpendicular to the height direction, a first lower surface conductor and a second lower surface conductor disposed on the lower surface of the base and separated from each other in the length direction, a first connection conductor connecting the first upper surface conductor to the first lower surface conductor, a second connection conductor connecting the second upper surface conductor to the second lower surface conductor, a third upper surface conductor and a fourth upper surface conductor disposed on the upper surface of the base, located between the first upper surface conductor and the second upper surface conductor in the length direction, and separated from each other, a third lower surface conductor and a fourth lower surface conductor disposed on the lower surface of the base, located between the first lower surface conductor and the second lower surface conductor in the length direction, and separated from each other; a third connection conductor connecting the third upper surface conductor to the third lower surface conductor, and a fourth connection conductor connecting the fourth upper surface conductor to the fourth lower surface conductor. The resistive element is disposed on the upper surface of the base and located between the first upper surface conductor and the second upper surface conductor in the length direction. In the resistor device according to the present preferred embodiment, the third upper surface conductor and the fourth upper surface conductor are connected to the resistive element. The first connection conductor and the second connection conductor are each defined by only a conductor located inside the base. The third connection conductor and the fourth connection conductor are each defined by only a conductor located inside the base.

In a resistor device according to another preferred embodiment of the present invention, the third upper surface conductor and the fourth upper surface conductor are separated from each other in a width direction perpendicular or substantially perpendicular to the height direction and to the length direction.

In a resistor device according to another preferred embodiment of the present invention, the third upper surface conductor and the fourth upper surface conductor may be separated from each other in the length direction.

In a resistor device according to another preferred embodiment of the present invention, at least one of the third connection conductor and the fourth connection conductor may include an inner connection conductor extending inside the base in a direction perpendicular or substantially perpendicular to the height direction, an upper via conductor connecting to the inner connection conductor, located between the upper surface of the base and the inner connection conductor, and extending in the height direction, and a lower via conductor connecting to the inner connection conductor, located between the lower surface of the base and the inner connection conductor, and extending in the height direction. In this case, the upper via conductor and the lower via conductor may not overlap each other at least partially, as seen in the height direction.

A resistor device according to another preferred embodiment of the present invention includes an electrically insulating base including an upper surface and a lower surface opposite to each other in a height direction, a resistive element disposed on the base, a first upper surface conductor and a second upper surface conductor disposed on the upper surface of the base and separated from each other in a length direction perpendicular or substantially perpendicular to the height direction, a first lower surface conductor and a second lower surface conductor disposed on the lower surface of the base and separated from each other in the length direction, a first connection conductor connecting the first upper surface conductor to the first lower surface conductor, a second connection conductor connecting the second upper surface conductor to the second lower surface conductor, a third upper surface conductor disposed on the upper surface of the base, and located between the first upper surface conductor and the second upper surface conductor in the length direction, a third lower surface conductor disposed on the lower surface of the base, and located between the first lower surface conductor and the second lower surface conductor in the length direction, and a third connection conductor connecting the third upper surface conductor to the third lower surface conductor. The resistive element is disposed on the upper surface of the base. In the resistor device according to the present preferred embodiment, the first upper surface conductor and the third upper surface conductor are connected to the resistive element. The first connection conductor and the second connection conductor are each defined by only a conductor located inside the base. The third connection conductor is defined by only a conductor located inside the base.

In a resistor device according to another preferred embodiment of the present invention, the third connection conductor may include an inner connection conductor extending inside the base in a direction perpendicular or substantially perpendicular to the height direction, an upper via conductor connecting to the inner connection conductor, located between the upper surface of the base and the inner connection conductor, and extending in the height direction, and a lower via conductor connecting to the inner connection conductor, located between the lower surface of the base and the inner connection conductor, and extending in the height direction. In this case, the upper via conductor and the lower via conductor may not overlap each other at least partially, as seen in the height direction.

Preferably, the resistor device according to another preferred embodiment of the present invention further includes a protective film covering the resistive element.

In a resistor device according to another preferred embodiment of the present invention, a maximum height of the protective film from the upper surface of the base may be larger than respective maximum heights of the first upper surface conductor and the second upper surface conductor from the upper surface of the base.

A resistor device according to another preferred embodiment of the present invention includes an electrically insulating base including an upper surface and a lower surface opposite to each other in a height direction, a resistive element disposed on the base, a first upper surface conductor and a second upper surface conductor disposed on the upper surface of the base and separated from each other in a length direction perpendicular or substantially perpendicular to the height direction, a first lower surface conductor and a second lower surface conductor disposed on the lower surface of the base and separated from each other in the length direction, a first connection conductor connecting the first upper surface conductor to the first lower surface conductor, a second connection conductor connecting the second upper surface conductor to the second lower surface conductor; and a third lower surface conductor and a fourth lower surface conductor disposed on the lower surface of the base, located between the first lower surface conductor and the second lower surface conductor in the length direction, and separated from each other. The resistive element is disposed on the lower surface of the base and located between the first lower surface conductor and the second lower surface conductor in the length direction. Regarding the resistor device according to the present preferred embodiment, the third lower surface conductor and the fourth lower surface conductor are connected to the resistive element. The first connection conductor and the second connection conductor are each defined by only a conductor located inside the base.

In a resistor device according to another preferred embodiment of the present invention, the third lower surface conductor and the fourth lower surface conductor may be separated from each other in a width direction perpendicular or substantially perpendicular to the height direction and to the length direction.

A resistor device according to another preferred embodiment of the present invention includes: an electrically insulating base including an upper surface and a lower surface opposite to each other in a height direction, a resistive element disposed on the base, a first upper surface conductor and a second upper surface conductor disposed on the upper surface of the base and separated from each other in a length direction perpendicular or substantially perpendicular to the height direction, a first lower surface conductor and a second lower surface conductor disposed on the lower surface of the base and separated from each other in the length direction, a first connection conductor connecting the first upper surface conductor to the first lower surface conductor, a second connection conductor connecting the second upper surface conductor to the second lower surface conductor, and a third lower surface conductor disposed on the lower surface of the base and located between the first lower surface conductor and the second lower surface conductor in the length direction. The resistive element is disposed on the lower surface of the base. Regarding the resistor device according to the present preferred embodiment, the first lower surface conductor and the third lower surface conductor are connected to the resistive element. The first connection conductor and the second connection conductor are each defined by only a conductor located inside the base.

Preferably, the resistor device according to another preferred embodiment of the present invention further includes a protective film covering the resistive element.

A resistor device according to another preferred embodiment of the present invention includes an electrically insulating base including an upper surface and a lower surface opposite to each other in a height direction, a resistive element disposed on the base, a first upper surface conductor and a second upper surface conductor disposed on the upper surface of the base and separated from each other in a length direction perpendicular or substantially perpendicular to the height direction, a first lower surface conductor and a second lower surface conductor disposed on the lower surface of the base and separated from each other in the length direction, a first connection conductor connecting the first upper surface conductor to the first lower surface conductor, a second connection conductor connecting the second upper surface conductor to the second lower surface conductor, a first inner conductor and a second inner conductor embedded in the base, located between the first connection conductor and the second connection conductor in the length direction, and separated from each other, a third lower surface conductor and a fourth lower surface conductor disposed on the lower surface of the base, located between the first lower surface conductor and the second lower surface conductor in the length direction, and separated from each other, a third connection conductor connecting the first inner conductor to the third lower surface conductor, and a fourth connection conductor connecting the second inner conductor to the fourth lower surface conductor. The resistive element is embedded in the base and located between the first connection conductor and the second connection conductor in the length direction. Regarding the resistor device according to the present preferred embodiment, the first inner conductor and the second inner conductor are connected to the resistive element. The first connection conductor and the second connection conductor are each defined by only a conductor located inside the base. The third connection conductor and the fourth connection conductor are each defined by only a conductor located inside the base.

In a resistor device according to another preferred embodiment of the present invention, the first inner conductor and the second inner conductor may be separated from each other in a width direction perpendicular or substantially perpendicular to the height direction and to the length direction.

In a resistor device according to another preferred embodiment of the present invention, the first inner conductor and the second inner conductor may be separated from each other in the length direction.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 1 is a schematic perspective view of a composite electronic component in a first preferred embodiment of the present invention.

FIG. 7A is an enlarged cross-sectional view of a main portion of the composite electronic component shown in FIG. 1.

FIG. 7B is an enlarged cross-sectional view of the main component of the composite electronic component according to another example configuration based on the first preferred embodiment of the present invention.

FIG. 14A is a top view of a resistor device shown in FIG. 12.

FIG. 14B is a cross-sectional view of the resistor device shown in FIG. 12.

FIG. 14C is a bottom view of the resistor device shown in FIG. 12.

FIG. 18A is a top view of a resistor device shown in FIG. 16.

FIG. 18B is a bottom view of the resistor device shown in FIG. 16.

FIG. 19 is a diagram showing an equivalent circuit of the composite electronic component shown in FIG. 16.

FIG. 20 is a side view of a composite electronic component in a fourth preferred embodiment of the present invention.

FIG. 27 is a cross-sectional view of the composite electronic component in FIG. 20 as seen in the direction indicated by an arrow XXVII-XXVII.

FIG. 29 is a cross-sectional view showing a state in which a composite electronic component according to a preferred embodiment of the present invention in which the direction in which internal electrode layers are stacked is parallel or substantially parallel to the height direction is sucked with a nozzle of a mounter.

FIG. 30 is a cross-sectional view showing a state in which a composite electronic component according to a preferred embodiment of the present invention in which the direction in which internal electrode layers are stacked is perpendicular or substantially perpendicular to the height direction is sucked with a nozzle of a mounter.

FIG. 41 is a side view showing a state where a composite electronic component in which a resistor device is larger in width than a capacitor device is mounted in an inclined posture on a circuit board.

DETAILED DESCRIPTION OF THE PREFERRED EMBODIMENTS

Figure 2A:
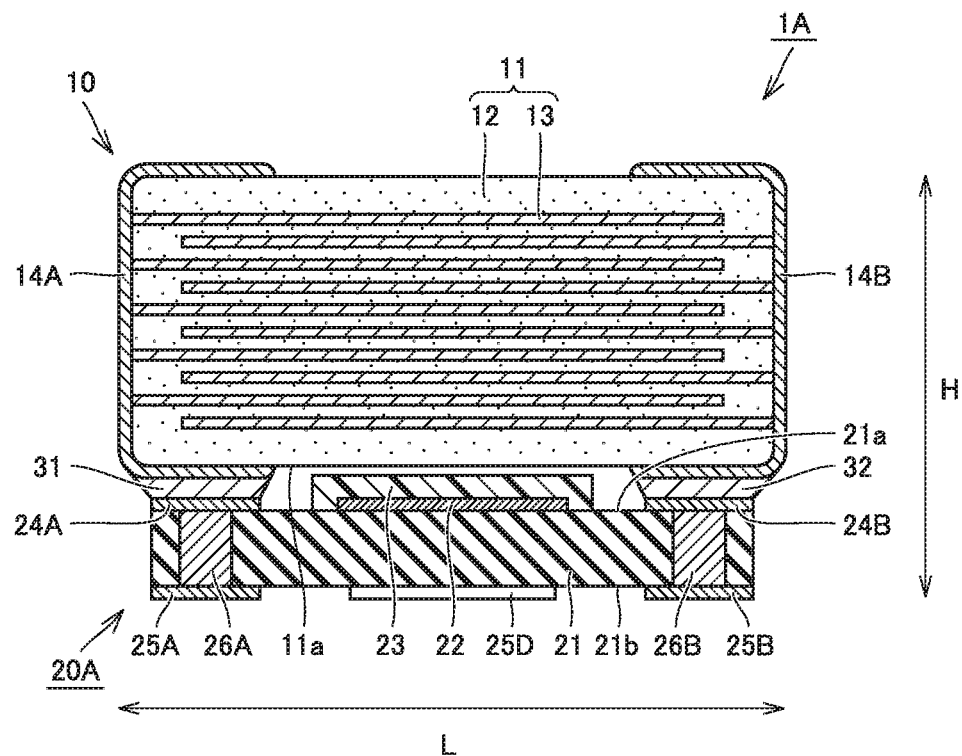
FIG. 2A is a schematic cross-sectional view along a line IIA-IIA shown in FIG. 1.

In the following, preferred embodiments of the present invention will be described in detail with reference to the drawings. Regarding the following preferred embodiments, the same or common elements in the drawings are denoted by the same reference characters, and a description thereof will not be repeated.

First Preferred Embodiment

Figure 2B:
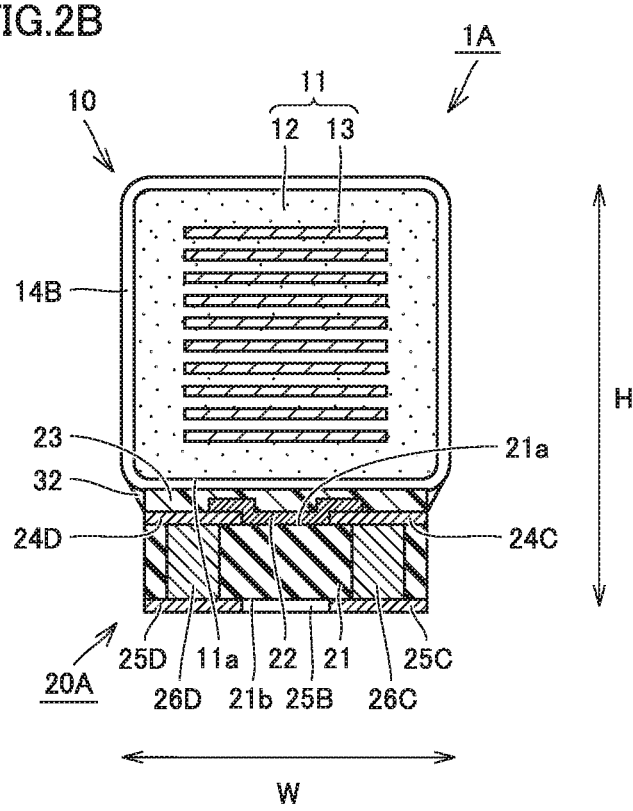
FIG. 2B is a schematic cross-sectional view along a line IIB-IIB shown in FIG. 1.
Figure 3A:
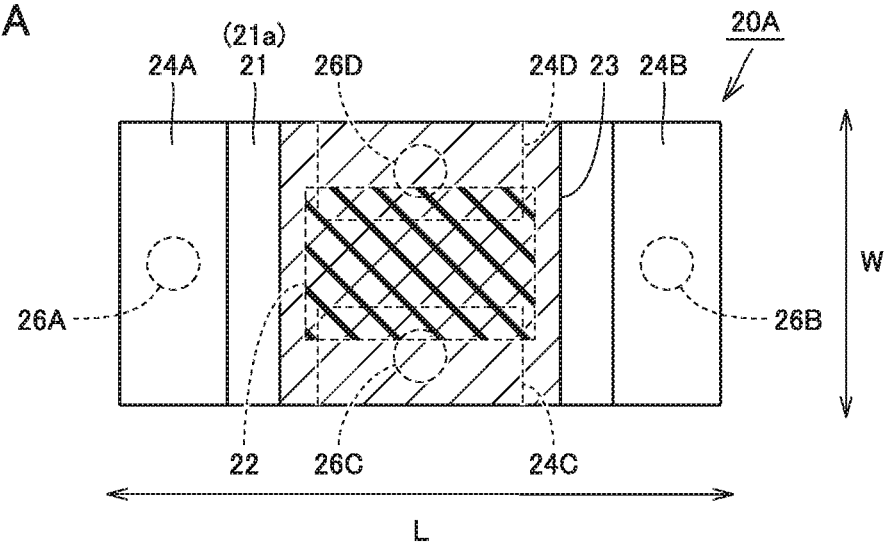
FIG. 3A is a top view and a bottom view of a resistor device shown in FIG. 1.
Figure 3B:
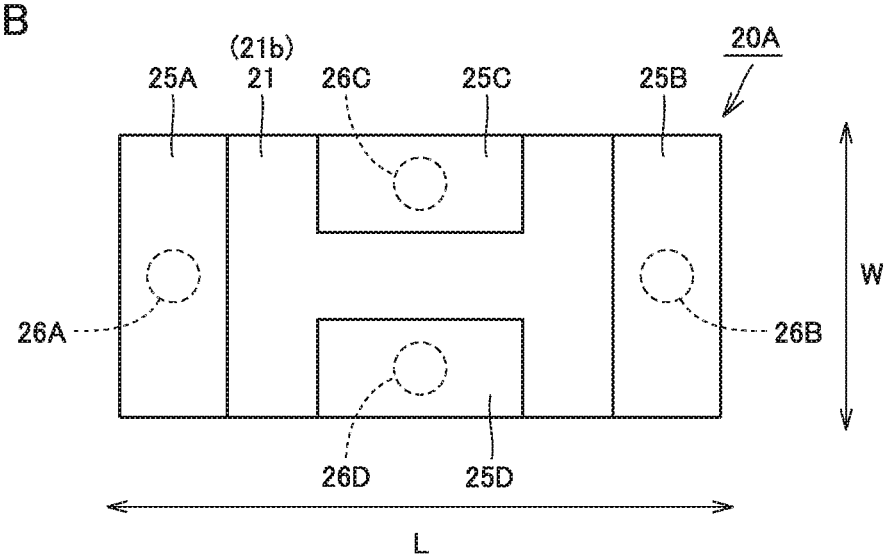
FIG. 3B is a top view and a bottom view of the resistor device shown in FIG. 1.
Figure 4:
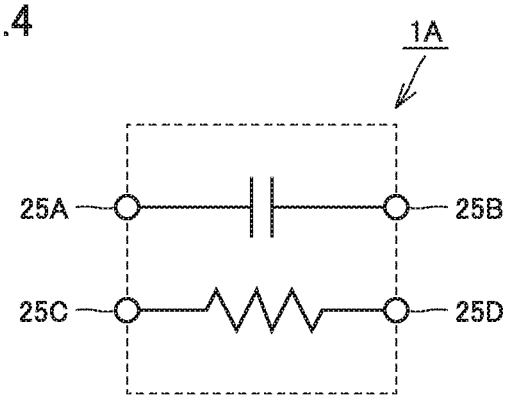
FIG. 4 is a diagram showing an equivalent circuit of the composite electronic component shown in FIG. 1.

FIG. 1 is a schematic perspective view of a composite electronic component in a first preferred embodiment of the present invention. FIG. 2A is a schematic cross-sectional view along a line IIA-IIA shown in FIG. 1. FIG. 2B is a schematic cross-sectional view along a line IIB-IIB shown in FIG. 1. FIG. 3A is a top view and a bottom view of a resistor device shown in FIG. 1. FIG. 3B is a top view and a bottom view of the resistor device shown in FIG. 1. FIG. 4 is a diagram showing an equivalent circuit of the composite electronic component shown in FIG. 1. Referring first to FIGS. 1 to 4, a composite electronic component 1A in the present preferred embodiment is described.

As shown in FIG. 1, composite electronic component 1A in the present preferred embodiment includes a capacitor device 10 and a resistor device 20A, and has a rectangular or substantially rectangular parallelepiped shape.

Capacitor device 10 has a rectangular or substantially rectangular parallelepiped shape, and has a dimension in a length direction L defined below larger than a dimension in a width direction W defined below. The rectangular or substantially rectangular parallelepiped shape referred to herein includes a rectangular parallelepiped shape of capacitor device 10 including vertices and edges that are rounded and/or with an external surface that is stepped or roughened, for example.

Resistor device 20A has an elongate flat plate shape, and has a dimension in length direction L larger than its dimension in width direction W. The flat plate shape includes a flat plate shape of resistor device 20A including vertices and edges that are rounded, and/or with an external surface that is stepped or roughened, for example.

Capacitor device 10 is disposed on resistor device 20A, and joined to resistor device 20A through a first joint member 31 and a second joint member 32 of a solder joint material or a conductive joint material, such as conductive adhesive, for example. The method of joining capacitor device 10 to resistor device 20A is not limited to the method of joining them with a conductive joint material, and another joining method may be used.

The direction in which capacitor device 10 and resistor device 20A are arranged is referred to as height direction H, the direction in which a first external electrode 14A and a second external electrode 14B of capacitor device 10 are arranged is referred to as length direction L, and the direction perpendicular or substantially perpendicular to both height direction H and length direction L is referred to as width direction W. These terms are used throughout the following description.

As shown in FIGS. 1, 2A and 2B, capacitor device 10 is preferably a multilayer ceramic capacitor, for example, and includes a capacitor body 11, and first and second external electrodes 14A and 14B. Capacitor body 11 has a rectangular or substantially rectangular parallelepiped shape, and first and second external electrodes 14A and 14B defined by a film and provided on the external surface of capacitor body 11 are separated from each other.

Capacitor body 11 includes a plurality of dielectric layers 12 and a plurality of internal electrode layers 13 that are alternately stacked. In the present preferred embodiment, the direction in which a plurality of dielectric layers 12 and a plurality of internal electrode layers 13 are stacked is preferably identical or substantially identical to height direction H. The direction in which these layers are stacked, however, may be identical or substantially identical to width direction W.

Dielectric layer 12 is preferably made of a ceramic material containing, as a main component, barium titanate ($BaTiO_3$), calcium titanate ($CaTiO_3$), strontium titanate ($SrTiO_3$), calcium zirconium ($CaZrO_3$), or other suitable material, for example. Dielectric layers 12 may preferably further contain, as an accessory component, Mn, Mg, Si, Co, Ni, rare earth, or other suitable component, for example. In contrast, internal electrode layer 13 is preferably made of a metal material, such as Ni, Cu, Ag, Pd, Ag—Pd alloy, Au, or other suitable metal material, for example.

First and second external electrodes 14A and 14B are each preferably defined by a conductive film that is a multilayer film of a sintered metal layer and a plating layer, for example. The sintered metal layer is formed by baking a paste of Cu, Ni, Ag, Pd, Ag—Pd alloy, Au, or other suitable paste. The plating layer preferably includes an Ni plating layer and an Sn plating layer covering the Ni plating layer, for example. Alternatively, the plating layer may be a Cu plating layer or Au plating layer. First and second external electrodes 14A and 14B may each be defined by a plating layer only, or by a hardened conductive resin paste containing a metal component and a resin component, for example.

Capacitor body 11 includes a pair of end surfaces opposite to each other in length direction L, a pair of side surfaces opposite to each other in width direction W, and a pair of main surfaces opposite to each other in height direction H. Among these surfaces, a lower surface 11a, which is one of the pair of main surfaces opposite to each other in height direction H, faces resistor device 20A.

First external electrode 14A is disposed to abut one end surface of capacitor body 11 and respective portions of the pair of side surfaces and the pair of main surfaces of capacitor body 11. Second external electrode 14B is disposed to abut the other end surface of capacitor body 11 and respective portions of the pair of side surfaces and the pair of main surfaces of capacitor body 11. Accordingly, lower surface 11a of capacitor body 11 is partially covered by first and second external electrodes 14A and 14B that are separated from each other in length direction L. Between first and second external electrodes 14A and 14B, lower surface 11a of capacitor body 11 is exposed.

As shown in FIGS. 2A and 2B, one of a pair of internal electrode layers 13 that are adjacent to each other in height direction H with dielectric layer 12 interposed therebetween is electrically connected, in capacitor device 10, to one of first and second external electrodes 14A and 14B, and the other internal electrode layer 13 is electrically connected, in capacitor device 10, to the other of first and second external electrodes 14A and 14B. Accordingly, between first and second external electrodes 14A and 14B, a plurality of capacitor elements (C) are electrically connected in parallel.

Capacitor device 10 may be manufactured, for example, by the following non-limiting example of a process. A raw sheet is prepared by printing an electrically conductive paste that is to form an internal electrode layer 13, on a surface of a ceramic sheet (so-called green sheet) that is to form a dielectric layer 12. A plurality of raw sheets thus prepared are stacked, joined together by pressure, and fired to produce capacitor body 11. After this, first and second external electrodes 14A and 14B are formed on the external surface of capacitor body 11 to form the capacitor device. A collective body into which a plurality of capacitor bodies 11 are integrated may be fabricated in advance, and the collective body may be separated into a plurality of capacitor bodies 11, and thereafter, first and second external electrodes 14A and 14B may be formed on each capacitor body 11.

As shown in FIGS. 1 to 3B, resistor device 20A includes an electrically insulating base 21, a resistive element 22, a protective film 23, first, second, third, and fourth upper surface conductors 24A, 24B, 24C, and 24D, first, second, third, and fourth lower surface conductors 25A, 25B, 25C, and 25D, and first, second, third, and fourth via conductors 26A, 26B, 26C, and 26D defining and functioning as first, second, third, and fourth connection conductors, respectively. Specifically, the first connection conductor and the second connection conductor are each preferably defined by only a via conductor extending in height direction H in base 21. The third connection conductor and the fourth connection conductor are each preferably defined by only a conductor located inside base 21.

Preferably, base 21 has a flat plate shape, and is made of a resin material, such as epoxy resin, a ceramic material such as alumina, or is made of a resin material or a ceramic material to which filler, woven fabric, or the like of an inorganic material or an organic material is added, for example. Preferably, an alumina substrate or a ceramic substrate including low temperature co-fired ceramic (LTCC) substrate is used as base 21.

Base 21 includes a pair of longitudinally-opposing side surfaces opposite to each other in length direction L, a pair of laterally-opposing side surfaces opposite to each other in width direction W, and a pair of main surfaces opposite to each other in height direction H. An upper surface 21a that is one of the pair of main surfaces faces capacitor device 10, and a lower surface 21b that is the other of the pair of main surfaces is a mount surface that faces a circuit board on which composite electronic component 1A is to be mounted.

As shown in FIGS. 2A to 3B, preferably, resistive element 22 is disposed at a predetermined position on upper surface 21a of base 21, and has a rectangular or substantially rectangular film shape as seen in the direction perpendicular or substantially perpendicular to upper surface 21a of base 21, for example. As resistive element 22, a metal film, a metal oxide film, a metal glaze film that is a mixture of a metal oxide film and glass, or the like may be used, for example.

Protective film 23 covers at least a portion of resistive element 22 on upper surface 21a of base 21, and is made of an electrically insulating film of a glass material, a resin material, or other suitable material. Preferably, protective film 23 covers the entire resistive element 22 so that resistive element 22 is not exposed outward.

First and second upper surface conductors 24A and 24B are disposed on upper surface 21a of base 21, and each defined by a rectangular or substantially rectangular conductive film. First and second upper surface conductors 24A and 24B are separated from each other in length direction L and located at the opposite ends in length direction L of upper surface 21a of base 21.

Third and fourth upper surface conductors 24C and 24D are disposed on upper surface 21a of base 21, and each defined by a rectangular or substantially rectangular conductive film. Third and fourth upper surface conductors 24C and 24D are located between first upper surface conductor 24A and second upper surface conductor 24B in length direction L. Third and fourth upper surface conductors 24C and 24C are separated from each other in width direction W and located at the opposite ends in width direction W of upper surface 21a of base 21.

In order for first to fourth upper surface conductors 24A to 24B to be prevented from peeling off from base 21, it is preferable to embed at least a portion of each of first to fourth upper surface conductors 24A to 24D in base 21. In particular, in order to prevent first and second upper surface conductors 24A and 24B from peeling off from base 21 due to a bonding force applied when capacitor device 10 is joined to resistor device 20A, at least a portion of each of first and second upper surface conductors 24A and 24B is embedded in base 21.

First and second lower surface conductors 25A and 25B are disposed on lower surface 21b of base 21, and each defined by a rectangular or substantially rectangular conductive film. First and second lower surface conductors 25A and 25B are separated from each other in length direction L and located at opposite ends, in length direction L of lower surface 21b of base 21.

Third and fourth lower surface conductors 25C and 25D are disposed on lower surface 21b of base 21, and each defined by a rectangular or substantially rectangular conductive film. Third and fourth lower surface conductors 25C and 25D are located between first lower surface conductor 25A and second lower surface conductor 25B in length direction L. Third and fourth lower surface conductors 25C and 25C are separated from each other in width direction W and located at the opposite ends in width direction W of lower surface 21b of base 21.

First and second via conductors 26A and 26B extend through base 21 in height direction H, and each have a circular or substantially circular shape as seen in the direction perpendicular or substantially perpendicular to upper surface 21a of base 21. As seen in the direction perpendicular or substantially perpendicular to upper surface 21a of base 21, first via conductor 26A overlaps first upper surface conductor 24A and first lower surface conductor 25A and connects first upper surface conductor 24A to first lower surface conductor 25A. As seen in the direction perpendicular or substantially perpendicular to upper surface 21a of base 21, second via conductor 26B overlaps second upper surface conductor 24B and second lower surface conductor 25B and connects second upper surface conductor 24B to second lower surface conductor 25B.

Third and fourth via conductors 26C and 26D extend through base 21 in height direction H, and each have a circular or substantially circular shape as seen in the direction perpendicular or substantially perpendicular to upper surface 21a of base 21. As seen in the direction perpendicular to upper surface 21a of base 21, third via conductor 26C overlaps third upper surface conductor 24C and third lower surface conductor 25C, and connects third upper surface conductor 24C to third lower surface conductor 25C. As seen in the direction perpendicular or substantially perpendicular to upper surface 21a of base 21, fourth via conductor 26D overlaps fourth upper surface conductor 24D and fourth lower surface conductor 25D, and connects fourth upper surface conductor 24D to fourth lower surface conductor 25D.

First to fourth upper surface conductors 24A to 24D, first to fourth lower surface conductors 25A to 25D, and first to fourth via conductors 26A to 26D may each be made or any of various conductive materials. Preferably, they may each be made of a metal material such as Cu, Ni, and Sn, and formed by plating, baking or hardening of a conductive paste, sputtering, or other suitable method, for example.

Resistive element 22 is located between first upper surface conductor 24A and second upper surface conductor 24B in length direction L, and one end in width direction W of resistive element 22 covers a portion of third upper surface conductor 24C and the other end in width direction W thereof covers a portion of fourth upper surface conductor 24D. Accordingly, third and fourth upper surface conductors 24C and 24D are connected to resistive element 22.

In order to prevent physical interference between resistor device 20A and capacitor device 10, the dimension in length direction L of resistive element 22 is preferably smaller than the distance between first external electrode 14A and second external electrode 14B of capacitor device 10.

In order to prevent contact with other conductive members, protective film 23 preferably covers not only resistive element 22 but also third and fourth upper surface conductors 24C and 24D. Third and fourth upper surface conductors 24C and 24D, however, may not necessarily be covered by protective film 23. Third and fourth upper surface conductors 24C and 24D may be covered only partially, or may not be covered at all.

Resistor device 20A may be manufactured, for example, by the following non-limiting example of a process.

First, electrically insulating base 21 is prepared. Through holes are formed in base 21. A conductive paste is applied to close the through holes and the conductive paste is hardened to form first to fourth via conductors 26A to 26D.

Next, a conductive paste is printed and baked on upper surface 21a and lower surface 21b of base 21, or a metal material is deposited by sputtering on upper surface 21a and lower surface 21b of base 21, for example, to form first to fourth upper surface conductors 24A to 24D and first to fourth lower surface conductors 25A to 25D.

Then, a material that is to form resistive element 22 is formed by printing or other suitable method on upper surface 21a of base 21 to connect resistive element 22 to third and fourth upper surface conductors 24C and 24D.

After this, a glass material, a resin material, or other suitable material is applied by printing or other suitable method onto upper surface 21a of base 21 to cover resistive element 22, and form protective film 23.

In this manner, resistor device 20A is manufactured. The above-described procedure is provided merely by way of example. The order of the steps in the above-described process may be partially changed (for example, first to fourth upper surface conductors 24A to 24D and first to fourth lower surface conductors 25A to 25D may be formed first and thereafter first to fourth via conductors 26A to 26D may be formed), or any method other than the above-described methods may be used to form each element. Alternatively, a collective body into which a plurality of resistor devices 20A are integrated may be fabricated in advance and the collective body may be divided into separate resistor devices 20A so that a plurality of resistor devices 20A are manufactured together.

As shown in FIGS. 1, 2A, and 2B, in composite electronic component 1A in the present preferred embodiment, capacitor device 10 and resistor device 20A are joined together through first and second joint members 31 and 32.

More specifically, capacitor device 10 is mounted on upper surface 21a of resistor device 20A in height direction H. Lower surface 11a of capacitor body 11 faces upper surface 21a of base 21 in height direction H, and first and second external electrodes 14A and 14B of capacitor device 10 are joined to respective corresponding first and second upper surface conductors 24A and 24B of resistor device 20A through first and second joint members 31 and 32, respectively.

Accordingly, first and second external electrodes 14A and 14B are electrically connected to first and second upper surface conductors 24A and 24B, respectively. Then, first and second upper surface conductors 24A and 24B and first and second via conductors 26A and 26B connected respectively to first and second upper surface conductors 24A and 24B define and function as a relay conductor for capacitor device 10 to electrically connect first and second external electrodes 14A and 14B to first and second lower surface conductors 25A and 25B, respectively.

Thus, first and second lower surface conductors 25A and 25B of resistor device 20A define and function as terminal conductors that are connecting terminals connecting capacitor device 10 to a circuit board.

In contrast, resistive element 22 of resistor device 20A is electrically connected to third and fourth upper surface conductors 24C and 24D of resistor device 20A as described above. Then, third and fourth via conductors 26C and 26D connected respectively to third and fourth upper surface conductors 24C and 24D define and function as a relay conductor for resistive element to electrically connect third and fourth upper surface conductors 24C and 24D to third and fourth lower surface conductors 25C and 25D, respectively.

Thus, third and fourth lower surface conductors 25C and 25D of resistor device 20A define and function as terminal conductors that are connecting terminals connecting resistor device 20A to a circuit board.

Accordingly, composite electronic component 1A in the present preferred embodiment includes four terminal conductors that are connecting terminals to a circuit board, and has an equivalent circuit as shown in FIG. 4.

Composite electronic component 1A configured in the above-described manner eliminates the need to provide a resistive element directly on the surface of the capacitor body, which facilitates processing during manufacture. Moreover, electrical characteristics of the resistive element are not restricted by the size of the capacitor body and/or the shape and the size, for example, of the pair of external electrodes disposed on the capacitor body. Consequently, the degree of freedom in designing the composite electronic component is significantly improved.

Composite electronic component 1A configured in the above-described manner also eliminates the need to fabricate capacitor device 10 and resistor device 20A so as to be integrated so that they are rectangular or substantially rectangular parallelepipeds that are identical or substantially identical in shape and size. Moreover, electrical characteristics of capacitor device 10 and resistor device 20A are not restricted in this sense. The degree of freedom in designing the composite electronic component is therefore significantly improved in this respect as well.

Further, regarding composite electronic component 1A configured in the above-described manner, the resistor element (R) and the capacitor element (C) are not electrically connected in parallel in composite electronic component 1A. In terms of circuit design, the degree of freedom in designing a circuit is also significantly improved. Specifically, the resistor element (R) and the capacitor element (C) are electrically connected to each other on a circuit board on which composite electronic component 1A is mounted, and therefore, they are able to be connected either in series or in parallel. In some cases, the resistor element and the capacitor element may be connected to respective separate circuits. Accordingly, a composite electronic component applicable to a wide variety of circuits is achieved.

In addition, composite electronic component 1A configured in the above-described manner also reduces the surface area on which the component is mounted, by integrating the capacitor device 10 and resistor device 20A into the composite electronic component.

In order to reduce the surface area, preferably, the dimension of capacitor device 10 in length direction L is larger than the dimension of resistor device 20A in length direction L, and the dimension of capacitor device 10 in width direction W is larger than the dimension of resistor device 20A in width direction W. In order to increase the capacitance of capacitor device 10, preferably, the dimension of capacitor device 10 in height direction H is larger than the dimension of resistor device 20A in height direction H.

As described above, regarding composite electronic component 1A and resistor device 20A included in composite electronic component 1A in the present preferred embodiment, the resistor element (R) and the capacitor element (C) each having desired electrical characteristics are easily combined, which enables a higher degree of freedom in designing the composite electronic component and a higher degree of freedom in designing a circuit on a circuit board on which the composite electronic component is mounted.

As capacitor device 10 to be integrated into the composite electronic component, multiple types of capacitor devices 10 that have different electrical characteristics may be prepared in advance. In addition, as resistor device 20A to be integrated into the composite electronic component, multiple types of resistor devices 20A having different electrical characteristics may be prepared in advance. Then, a capacitor device and a resistor device may be selected and combined appropriately. In this manner, a composite electronic component including both a resistor element (R) and a capacitor element (C) having desired electrical characteristics is easily manufactured. The multiple types of capacitor devices may not necessarily be identical to each other in shape and dimensions, and the multiple types of resistor devices may not necessarily be identical to each other in shape and dimensions. As long as a selected type of capacitor device and a selected type of resistor device are able to be stacked and combined into a composite electronic component, the multiple types of capacitor devices may be different and the multiple types of resistor devices may be different in terms of shape and dimensions.

In the present preferred embodiment, third upper surface conductor 24C and fourth upper surface conductor 24D that are connected to resistive element 22 are separated from each other in width direction W perpendicular or substantially perpendicular to length direction L in which first upper surface conductor 24A and second upper surface conductor 24B defining and functioning as a relay conductor for capacitor device 10 are arranged. This configuration enables an increase in distances by which first to fourth upper surface conductors 24A and 24D are separated from each other as well as an increase in the area in which resistive element 22 may be provided on upper surface 21a of base 21. Both electrical insulation between first to fourth upper surface conductors 24A to 24D and a high degree of freedom in adjusting electrical characteristics of resistive element 22 are therefore provided.

Figure 5:
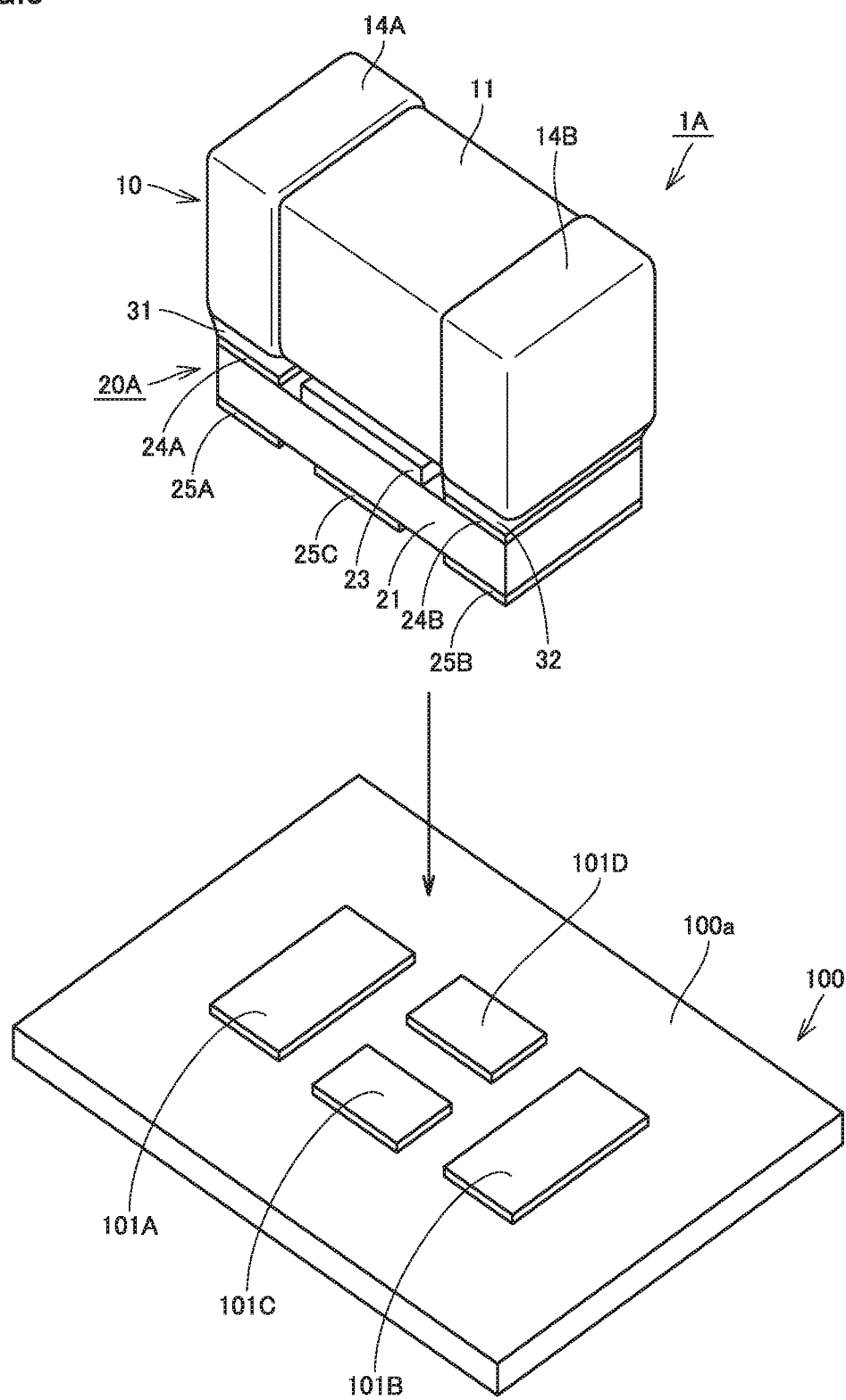
FIG. 5 is a schematic perspective view illustrating how the composite electronic component shown in FIG. 1 is mounted on a circuit board.
Figure 6A:
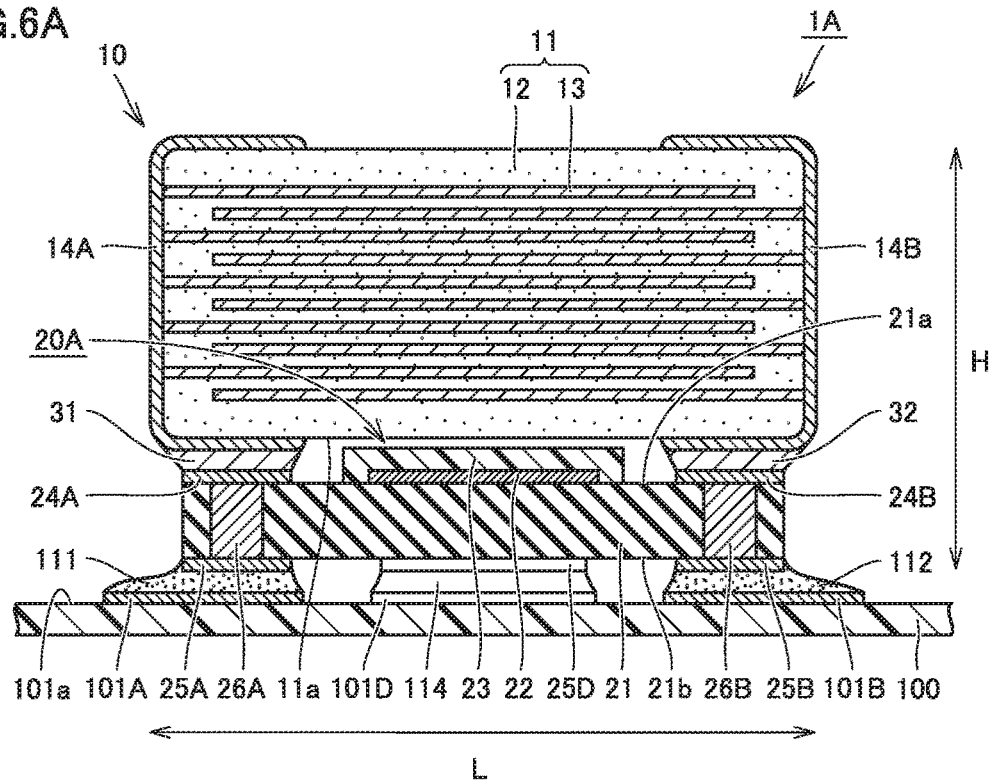
FIG. 6A is a lengthwise cross-sectional view of a mount structure including the composite electronic component shown in FIG. 1.
Figure 6B:
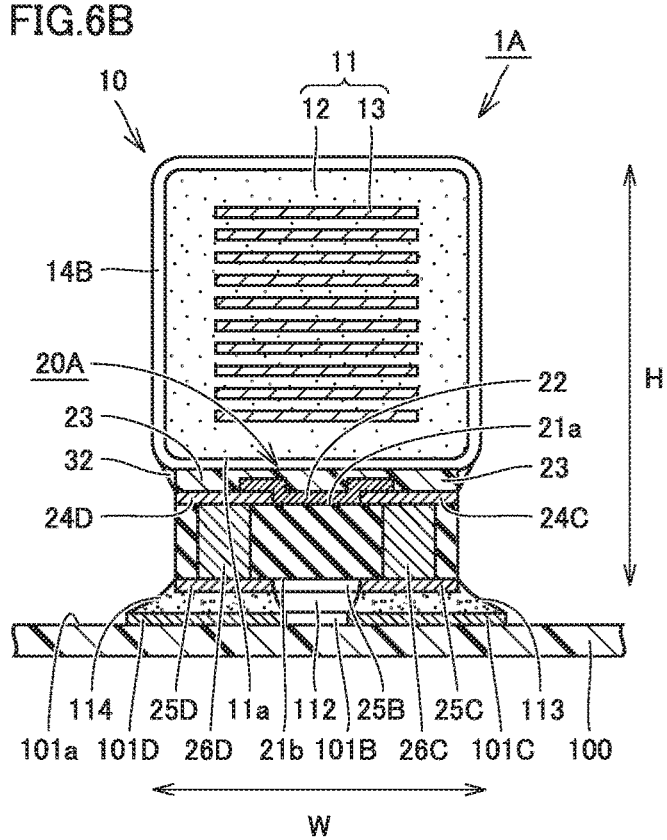
FIG. 6B is a widthwise cross-sectional view of the mount structure including the composite electronic component shown in FIG. 1.

FIG. 5 is a schematic perspective view illustrating how the composite electronic component shown in FIG. 1 is mounted on a circuit board. FIG. 6A is a lengthwise cross-sectional view of a mount structure including the composite electronic component shown in FIG. 1. FIG. 6B is a widthwise cross-sectional view of the mount structure including the composite electronic component shown in FIG. 1. Referring next to FIGS. 5, 6A, and 6B, a mount structure to mount composite electronic component 1A on a circuit board 100 in the present preferred embodiment is described.

As shown in FIG. 5, composite electronic component 1A is mounted on circuit board 100 by disposing composite electronic component 1A so that lower surface 21b of base 21 of resistor device 20A faces a main surface 100a of circuit board 100, and using a solder joint material or a conductive joint material, such as conductive adhesive.

As shown in FIGS. 5, 6A, and 6B, circuit board 100 is an electrically insulating substrate including a conductive pattern provided on main surface 100a. As a material for circuit board 100, a resin material, such as epoxy resin, a ceramic material, such as alumina, or a resin material or a ceramic material to which filler, woven fabric, or other suitable material of an inorganic material or an organic material is added, for example, may be used. Generally, a glass epoxy substrate in which glass woven fabric is added to a base material of epoxy resin is preferably used as circuit board 100.

On main surface 100a of circuit board 100, first to fourth lands 101A to 101D are provided for composite electronic component 1A. First to fourth lands 101A to 101D each correspond to a portion of the conductive pattern and are separated from each other.

The first to fourth lands 101A to 101D preferably have respective sizes corresponding to respective sizes of first to fourth lower surface conductors 25A to 25D respectively of composite electronic component 1A, and include respective portions facing their respective first to fourth lower surface conductors 25A to 25D in the direction perpendicular or substantially perpendicular to main surface 100a of circuit board 100. As the material for first to fourth lands 101A to 101D, any of various conductive materials may be used, and preferably a metal material such as Cu is used, for example.

The first to fourth lower surface conductors 25A to 25D of composite electronic component 1A are joined to the first to fourth lands 101A to 101D disposed on circuit board 100 by first, second, third, and fourth joint mount members 111, 112, 113, and 114 each made of a conductive joint material.

Desired lands of first to fourth lands 101A to 101D may be electrically connected to each other to enable capacitor device and resistor device 20A included in composite electronic component 1A to be connected either in series or in parallel on circuit board 100.

FIG. 7A is an enlarged cross-sectional view of a main portion of the composite electronic component in the present preferred embodiment. FIG. 7B is an enlarged cross-sectional view of the main component of the composite electronic component according to another example configuration based on the present preferred embodiment.

As shown in FIG. 7A, in composite electronic component 1A in the present preferred embodiment, first and second joint members 31 and 32 are located between first and second upper surface conductors 24A and 24B on upper surface 21a of base 21 of resistor device 20A and first and second external electrodes 14A and 14B located on lower surface 11a of capacitor body 11 of capacitor device 10, respectively.

The distance in height direction H between upper surface 21a of base 21 and lower surface 11a of capacitor body 11 is, therefore, the sum of the thickness in height direction H of each of first and second upper surface conductors 24A and 24B, the thickness in height direction H of the portion of each of first and second external electrodes 14A and 14B facing first and second upper surface conductors 24A and 24B, and the thickness in height direction H of each of first and second joint members 31 and 32.

Resistive element 22 and protective film 23 disposed on upper surface 21a of base 21 face the exposed portion of lower surface 11a of capacitor body 11.

Accordingly, regarding composite electronic component 1A in the present preferred embodiment, even when a maximum height H1 of first and second upper surface conductors 24A and 24B from upper surface 21a of base 21 and a maximum height H2 of protective film 23 from upper surface 21a satisfy the condition H1<H2, protective film 23 and resistive element 22 do not physically interfere with capacitor device 10 as long as maximum height H2 is smaller than the distance in height direction H between upper surface 21a of base 21 and lower surface 11a of capacitor body 11. Thus, an increase of the dimension in height direction H of composite electronic component 1A is prevented. Preferably, maximum height H2 is smaller than the sum of maximum height H1 and the thickness of the portion of first and second external electrodes 14A and 14B located on lower surface 11a of capacitor device 10.

As shown in FIG. 7B, regarding a composite electronic component 1A' according to another example configuration based on the present preferred embodiment, resistive element 22 is not covered by the protective film and is exposed on upper surface 21a of base 21.

First Modification

Figure 8A:
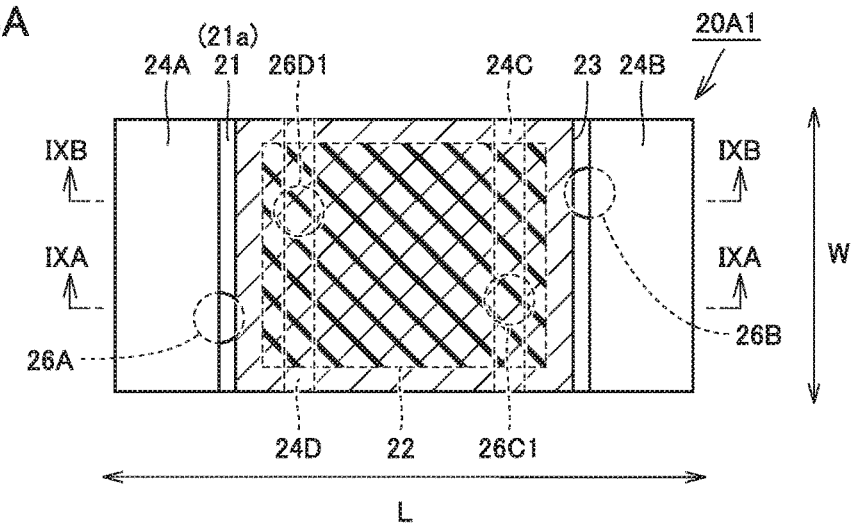
FIG. 8A is a top view of a resistor device according to a first modification of the first preferred embodiment of the present invention.
Figure 8B:
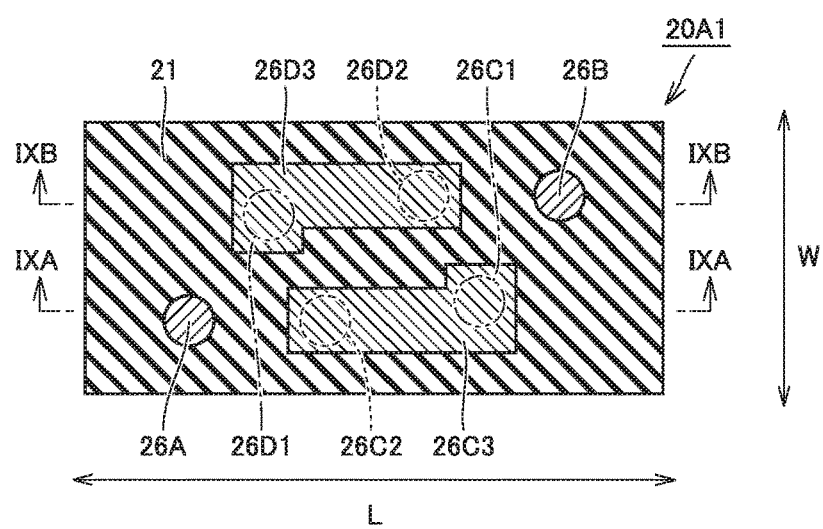
FIG. 8B is a cross-sectional view of the resistor device according to the first modification.
Figure 8C:
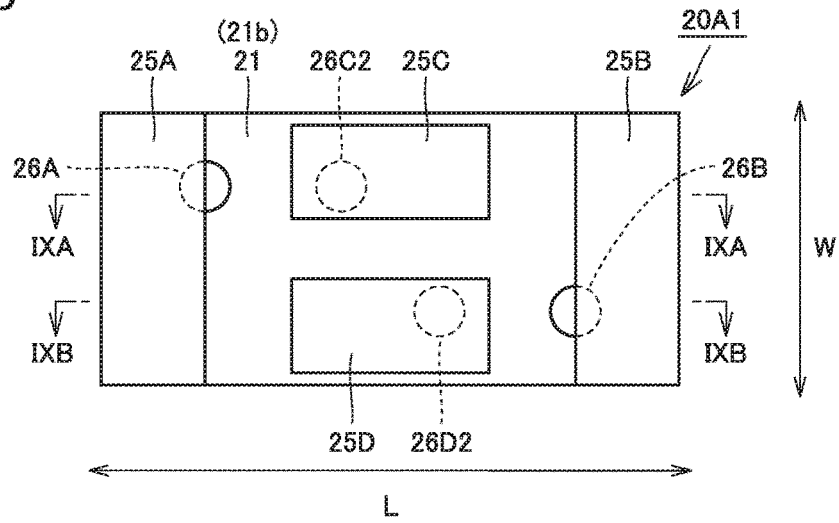
FIG. 8C is a bottom view of the resistor device according to the first modification.
Figure 9A:
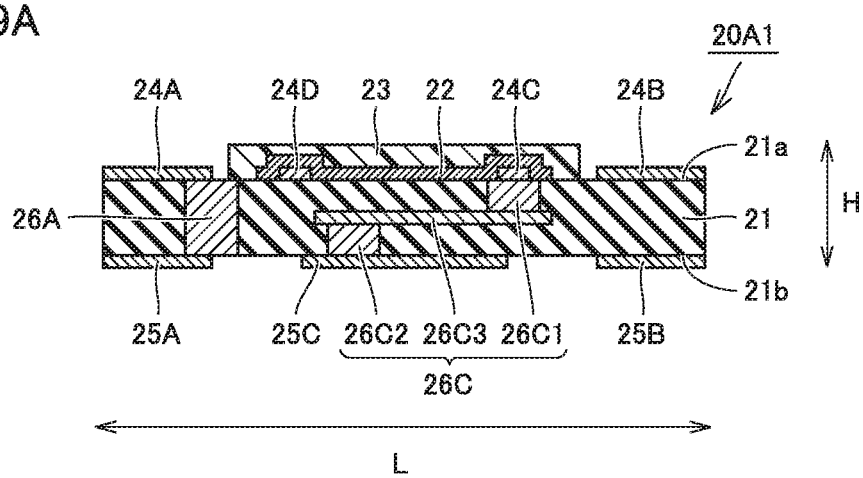
FIG. 9A is a schematic cross-sectional view along a line IXA-IXA shown in FIG. 8.
Figure 9B:
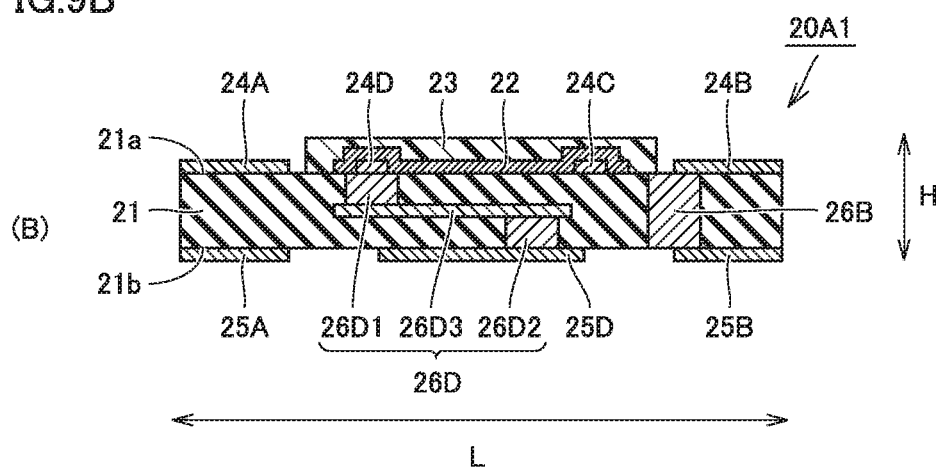
FIG. 9B is a schematic cross-sectional view along a line IXB-IXB shown in FIG. 8.

FIG. 8A is a top view of a resistor device according to a first modification of a preferred embodiment of the present invention. FIG. 8B is a cross-sectional view of the resistor device according to the first modification. FIG. 8C is a bottom view of the resistor device according to the first modification. FIG. 9A is a schematic cross-sectional view along a line IXA-IXA shown in FIG. 8. FIG. 9B is a schematic cross-sectional view along a line IXB-IXB shown in FIG. 8. Referring to FIGS. 8A to 9B, a resistor device 20A1 according to the first modification is described.

As shown in FIGS. 8A to 9B, resistor device 20A1 in the first modification differs from resistor device 20A in the layout of elements on upper surface 21a of base 21 and lower surface 21b of base 21 and, accordingly, in the configuration of first to fourth connection conductors.

Specifically, third and fourth upper surface conductors 24C and 24D are located between first upper surface conductor 24A and second upper surface conductor 24B in length direction L, and separated from each other in length direction L. Third and fourth upper surface conductors 24C and 24D are each preferably rectangular or substantially rectangular and extend long in width direction W, as seen in the direction perpendicular or substantially perpendicular to upper surface 21a of base 21. The dimension in width direction W of third and fourth upper surface conductors 24C and 24D may be identical to or smaller than that of first and second upper surface conductors 24A and 24B.

Resistive element 22 is located between first upper surface conductor 24A and second upper surface conductor 24B in length direction L, and one end of resistive element 22 in length direction L covers third upper surface conductor 24C and the other end thereof in length direction L covers fourth upper surface conductor 24D. Accordingly, third and fourth upper surface conductors 24C and 24D are connected to resistive element 22.

In the first modification, a larger area of resistive element 22 as seen in the direction perpendicular or substantially perpendicular to upper surface 21a of base 21 is provided, as compared to the first preferred embodiment described above, and therefore, a higher degree of freedom in adjusting electrical characteristics of resistive element 22 is achieved.

Third and fourth lower surface conductors 25C and 25D are located between first lower surface conductor 25A and second lower surface conductor 25B in length direction L, and separated from each other in width direction W.

In this case, as seen in the direction perpendicular or substantially perpendicular to upper surface 21a of base 21, third upper surface conductor 24C does not necessarily overlap third lower surface conductor 25C, and fourth upper surface conductor 24D does not necessarily overlap fourth lower surface conductor 25D. Particularly, when third upper surface conductor 24C and fourth upper surface conductor 24D are further separated from each other in length direction L in order to further increase the area of resistive element 22, these conductors do not overlap each other as seen in the direction perpendicular or substantially perpendicular to upper surface 21a of base 21 on the resultant layout.

In view of this, in resistor device 20A1 in the first modification, third and fourth via conductors 26C and 26D defining third and fourth connection conductors each include multiple conductors connected to each other to enable the layout of the first modification to be provided.

Specifically, in resistor device 20A1 in the first modification, third via conductor 26C connecting third upper surface conductor 24C to third lower surface conductor 25C preferably includes an inner connection conductor 26C3 extending inside base 21 in the direction perpendicular or substantially perpendicular to height direction H, an upper via conductor 26C1 connecting to inner connection conductor 26C3, located between upper surface 21a of base 21 and inner connection conductor 26C3, and extending in height direction H, and a lower via conductor 26C2 connecting to inner connection conductor 26C3, located between lower surface 21b of base 21 and inner connection conductor 26C3, and extending in height direction H. As seen in the direction perpendicular or substantially perpendicular to upper surface 21a of base 21, upper via conductor 26C1 and lower via conductor 26C2 do not overlap each other at all.

In this configuration, even when third upper surface conductor 24C does not overlap third lower surface conductor 25C in the layout as seen in the direction perpendicular or substantially perpendicular to upper surface 21a of base 21, third upper surface conductor 24C and third lower surface conductor 25C are able to be connected through upper via conductor 26C1, lower via conductor 26C2, and inner connection conductor 26C3.

Moreover, in resistor device 20A1 in the first modification, fourth via conductor 26D connecting fourth upper surface conductor 24D to fourth lower surface conductor 25D preferably includes an inner connection conductor 26D3 extending inside base 21 in the direction perpendicular or substantially perpendicular to height direction H, an upper via conductor 26D1 connecting to inner connection conductor 26D3, located between upper surface 21a of base 21 and inner connection conductor 26D3, and extending in height direction H, and a lower via conductor 26D2 connecting to inner connection conductor 26D3, located between lower surface 21b of base 21 and inner connection conductor 26D3, and extending in height direction H. As seen in the direction perpendicular or substantially perpendicular to upper surface 21a of base 21, upper via conductor 26D1 and lower via conductor 26D2 do not overlap each other at all.

In this configuration, even when fourth upper surface conductor 24D does not overlap fourth lower surface conductor 25D in the layout as seen in the direction perpendicular or substantially perpendicular to upper surface 21a of base 21, fourth upper surface conductor 24D and fourth lower surface conductor 25D are able to be connected through upper via conductor 26D1, lower via conductor 26D2, and inner connection conductor 26D3.

Therefore, use of the above-described configuration easily enables the direction in which third and fourth upper surface conductors 24C and 24D are arranged to be different from the direction in which third and fourth lower surface conductors 25C and 25D are arranged.

Preferably, however, the via conductors that extend to the upper surface or the lower surface of the base to be exposed from the outer surface of the resistor device completely overlap the upper surface conductor and the lower surface conductor, to ensure mounting stability and to prevent the occurrence of short-circuit failure, as long as the design allows such a configuration.

In resistor device 20A1 in the first modification, the first to fourth connection conductors are preferably defined by only first to fourth via conductors 26A to 26D.

To facilitate processing, preferably, first to fourth via conductors 26A to 26D disposed in base 21 are spaced away, by a predetermined distance (about 50 μm or more, for example), from a pair of side surfaces of base 21 in the length direction and a pair of side surfaces of base 21 in the width direction. Preferably, the diameter of first to fourth via conductors 26A to 26D is appropriately large (about 80 μm or more, for example). In this case, the configuration of the first modification enables an increase in the size of the resistor device to be significantly reduced or minimized.

The inner connection conductor is used to connect the upper via conductor to the lower via conductor, by way of example. However, when the upper via conductor and the lower via conductor are able to be arranged so as to overlap each other as seen in the direction perpendicular or substantially perpendicular to upper surface 21a of base 21, the upper via conductor may be directly connected to the lower via conductor without providing the inner connection conductor.

Second Modification

Figure 10A:
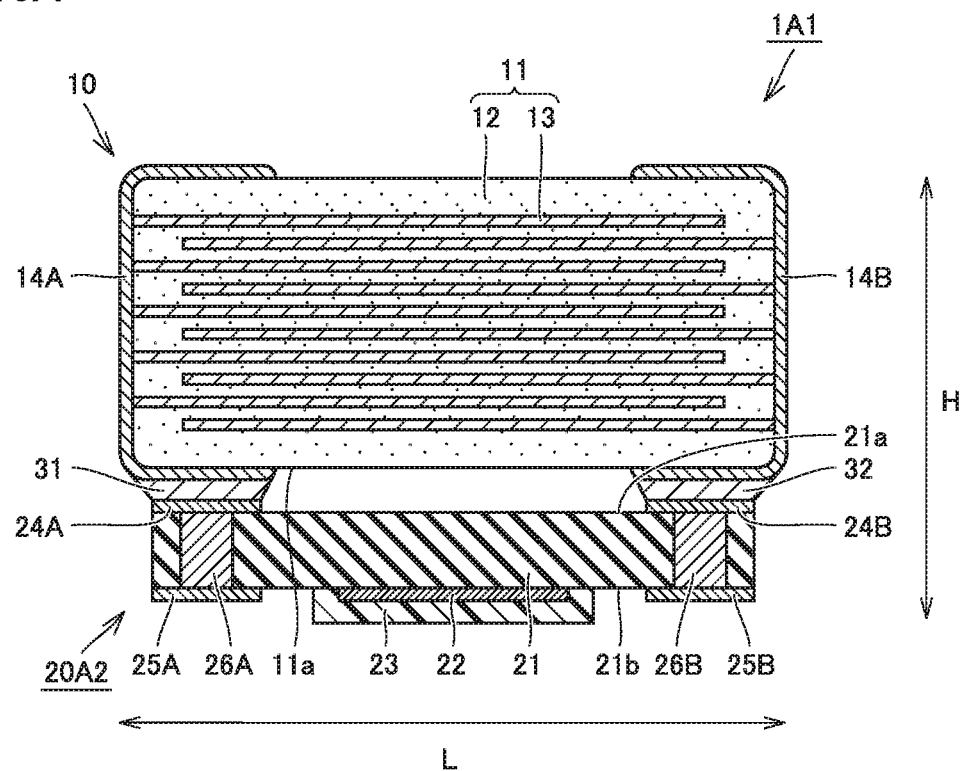
FIG. 10A is a lengthwise cross-sectional view of a composite electronic component according to a second modification of the first preferred embodiment of the present invention.
Figure 10B:
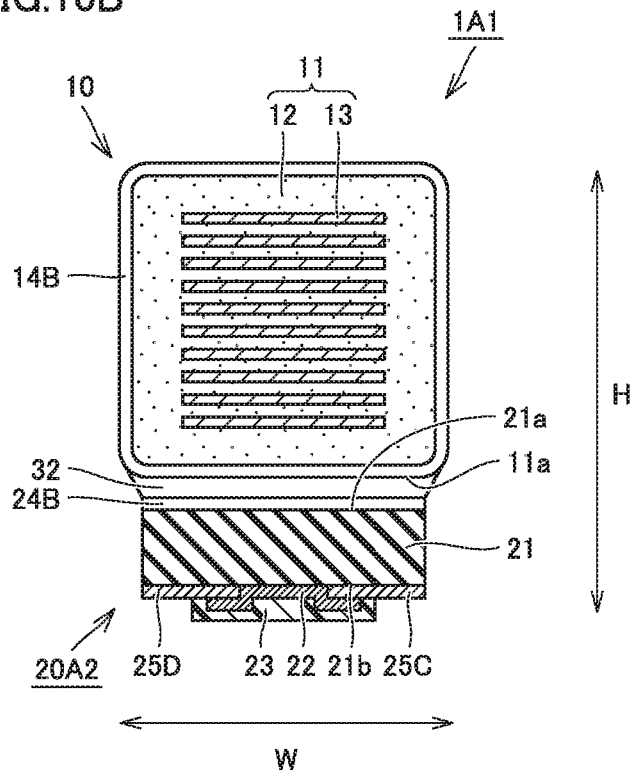
FIG. 10B is a widthwise cross-sectional view of the composite electronic component according to the second modification.

FIG. 10A is a lengthwise cross-sectional view of a composite electronic component according to a second modification of a preferred embodiment of the present invention. FIG. 10B is a widthwise cross-sectional view of the composite electronic component according to the second modification. Referring to FIGS. 10A and 10B, a composite electronic component 1A1 according to the second modification is described below.

As shown in FIGS. 10A and 10B, composite electronic component 1A1 in the second modification differs from composite electronic component 1A in that the composite electronic component 1A1 includes a differently configured resistor device 20A2. Resistor device 20A2 differs from resistor device 20A primarily in the position of resistive element 22 disposed on base 21. Specifically, resistive element 22 is preferably disposed on the lower surface of base 21 and located between first lower surface conductor 25A and second lower surface conductor 25B in length direction L.

One end in width direction W of this resistive element 22 covers a portion of third lower surface conductor 25C and the other end in width direction W thereof covers a portion of fourth lower surface conductor 25D. Accordingly, third and fourth lower surface conductors 25C and 25D are connected to resistive element 22.

Although resistor device 20A2 in the second modification does not include third and fourth upper surface conductors 24C and 24D and third and fourth via conductors 26C and 26D included in above-described resistor device 20A, resistor device 20A2 may include them without suffering from any particular disadvantages.

The above-described configuration of the second modification also produces similar effects such as those described above in connection with the preferred embodiments described above, and enables a resistor element (R) and a capacitor element (C) having desired electrical characteristics to be easily combined at low cost. Accordingly, a higher degree of freedom in designing the composite electronic component as well as a higher degree of freedom in designing a circuit on a circuit board on which the composite electronic component is mounted are achieved.

Third Modification

Figure 11A:
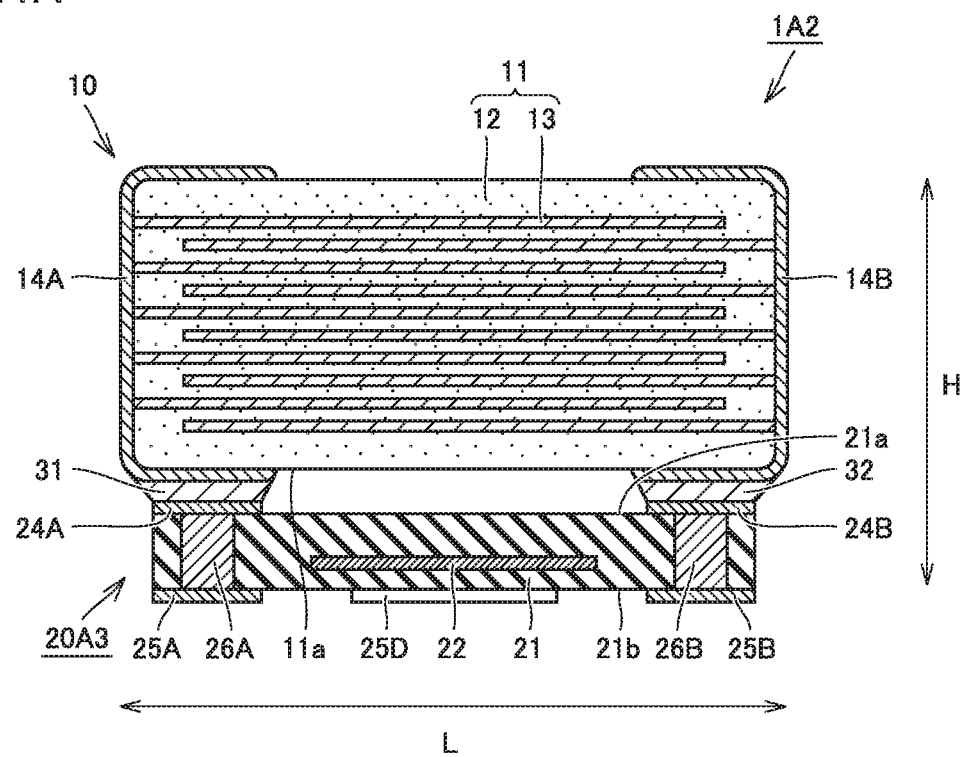
FIG. 11A is a lengthwise cross-sectional view of a composite electronic component according to a third modification of the first preferred embodiment of the present invention.
Figure 11B:
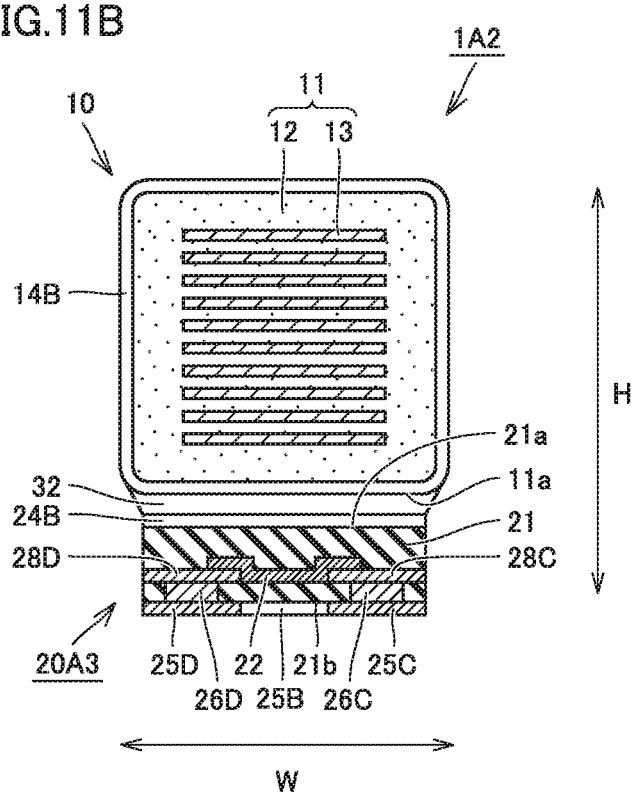
FIG. 11B is a widthwise cross-sectional view of the composite electronic component according to the third modification.

FIG. 11A is a lengthwise cross-sectional view of a composite electronic component according to a third modification of a preferred embodiment of the present invention. FIG. 11B is a widthwise cross-sectional view of the composite electronic component according to the third modification. Referring to FIGS. 11A and 11B, a composite electronic component 1A2 according to the third modification is described below.

As shown in FIGS. 11A and 11B, composite electronic component 1A2 in the third modification differs from composite electronic component 1A in that the composite electronic component 1A2 includes a differently configured resistor device 20A3. Resistor device 20A3 differs from resistor device 20A primarily in the position of resistive element 22 of base 21. Specifically, resistive element 22 is embedded in base 21 and located between first via conductor 26A and second via conductor 26B in length direction L.

Then, first and second inner conductors 28C and 28D are disposed in base 21 that are located between first via conductor 26A and second via conductor 26B in the length direction and separated from each other in width direction W. First and second inner conductors 28C and 28D are arranged at the opposite ends of base 21 in width direction W.

One end in width direction W of resistive element 22 covers a portion of first inner conductor 28C and the other end in width direction W thereof covers a portion of second inner conductor 28D. Accordingly, first and second inner conductors 28C and 28D are connected to resistive element 22.

As seen in the direction perpendicular or substantially perpendicular to upper surface 21a of base 21, third via conductor 26C overlaps first inner conductor 28C and third lower surface conductor 25C, and connects first inner conductor 28C to third lower surface conductor 25C. As seen in the direction perpendicular or substantially perpendicular to upper surface 21a of base 21, fourth via conductor 26D overlaps second inner conductor 28D and fourth lower surface conductor 25D, and connects second inner conductor 28D to fourth lower surface conductor 25D.

As shown in FIGS. 11A and 11B, resistor device 20A3 in the third modification may not include third and fourth upper surface conductors 24C and 24D included in resistor device 20A.

The above configuration of the third modification also produces similar effects to those described above in connection with the present preferred embodiment, and enables a resistor element (R) and a capacitor element (C) having desired electrical characteristics to be easily combined at low cost. Accordingly, a higher degree of freedom in designing the composite electronic component as well as a higher degree of freedom in designing a circuit on a circuit board on which the composite electronic component is mounted are achieved.

Second Preferred Embodiment

Figure 12:
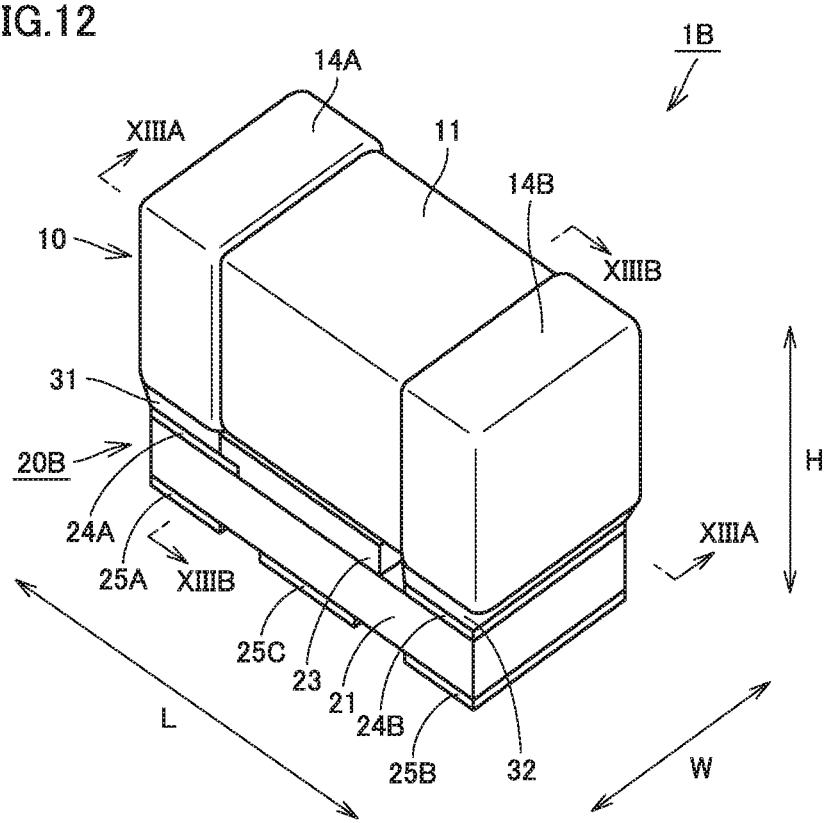
FIG. 12 is a schematic perspective view of a composite electronic component in a second preferred embodiment of the present invention.
Figure 13A:
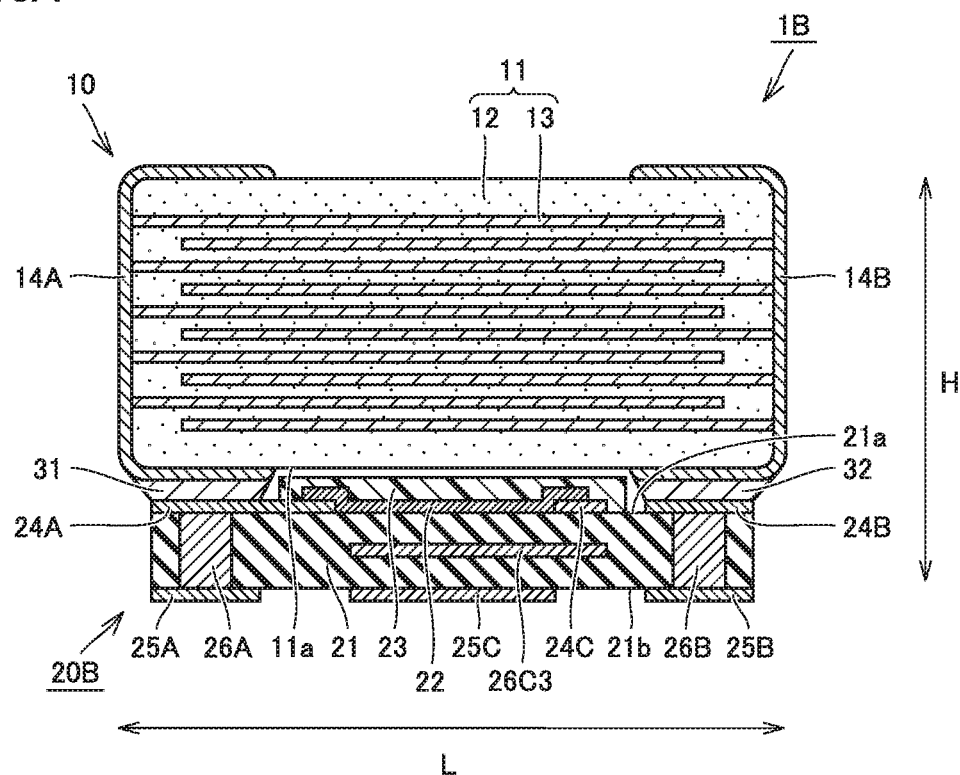
FIG. 13A is a schematic cross-sectional view along a line XIIIA-XIIIA shown in FIG. 12.
Figure 13B:
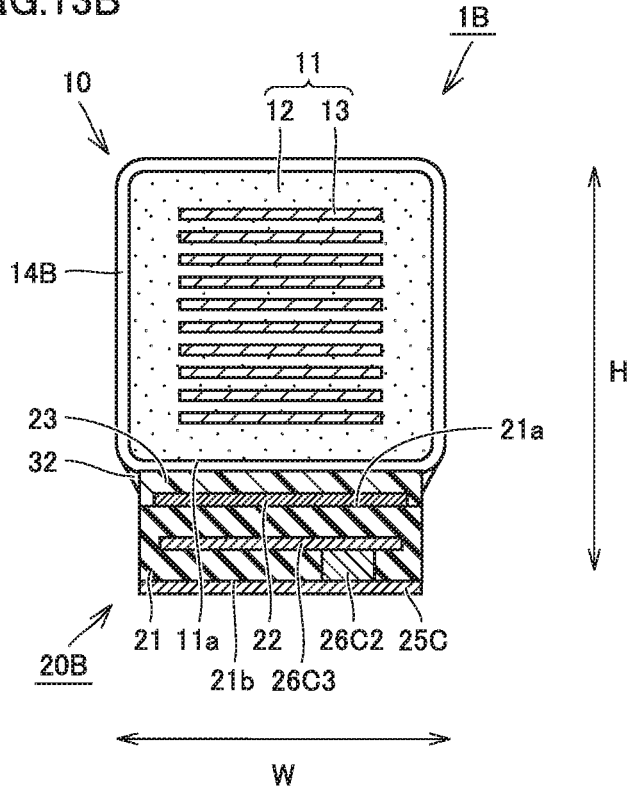
FIG. 13B is a schematic cross-sectional view along a line XIIIB-XIIIB shown in FIG. 12.
Figure 15:
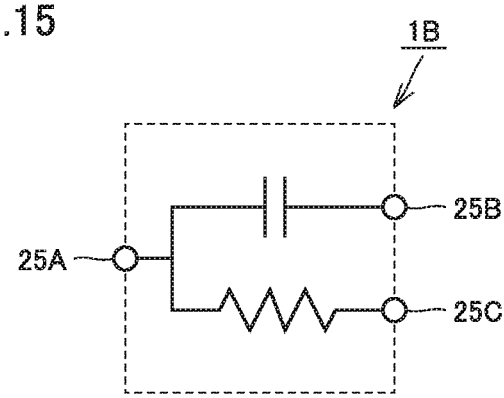
FIG. 15 is a diagram showing an equivalent circuit of the composite electronic component shown in FIG. 12.

FIG. 12 is a schematic perspective view of a composite electronic component in a second preferred embodiment of the present invention. FIG. 13A is a schematic cross-sectional view along a line XIIIA-XIIIA shown in FIG. 12. FIG. 13B is a schematic cross-sectional view along a line XIIIB-XIIIB shown in FIG. 12. FIG. 14A is a top view of a resistor device shown in FIG. 12. FIG. 14B is a cross-sectional view of the resistor device shown in FIG. 12. FIG. 14C is a bottom view of the resistor device shown in FIG. 12. FIG. 15 is a diagram showing an equivalent circuit of the composite electronic component shown in FIG. 12. Referring to FIGS. 12 to 15, a composite electronic component 1B in the present preferred embodiment is described below.

As shown in FIGS. 12 to 14C, composite electronic component 1B in the present preferred embodiment differs from composite electronic component 1A in that composite electronic component 1B includes a differently configured resistor device 20B. Resistor device 20B differs from resistor device 20A primarily in that resistor device 20B does not include fourth upper surface conductor 24D, fourth lower surface conductors 25D, and fourth via conductor 26D. In the present preferred embodiment, the first connection conductor and the second connection conductor are each preferably defined by only a conductor located inside base 21. Third connection conductor is preferably defined by only a conductor located inside base 21.

Specifically, as shown in FIGS. 13A to 14C, in the portion of upper surface 21a of base 21 that is located between first and second upper surface conductors 24A and 24B in length direction L, resistor device 20B includes only third upper surface conductor 24C. As seen in the direction perpendicular or substantially perpendicular to upper surface 21a of base 21, third upper surface conductor 24C is rectangular or substantially rectangular and extends in width direction W. The dimension in width direction W of third upper surface conductor 24C may be identical to or smaller than that of first and second upper surface conductors 24A and 24B.

One end in length direction L of resistive element 22 covers a portion of first upper surface conductor 24A and the other end in length direction L thereof covers a portion of third upper surface conductor 24C. Accordingly, first and third upper surface conductors 24A and 24C are connected to resistive element 22.

The distance between third upper surface conductor 24C and second upper surface conductor 24B is preferably smaller than the distance between first upper surface conductor 24A and second upper surface conductor 24B. In this manner, a larger area of resistive element 22 as seen in the direction perpendicular or substantially perpendicular to upper surface 21a of base 21 is provided. Thus, the degree of freedom in adjusting electrical characteristics of resistive element 22 is further improved.

Third via conductor 26C is located between first via conductor 26A and second via conductor 26B in length direction L, and third lower surface conductor 25C is located between first lower surface conductor 25A and second lower surface conductor 25B in length direction L.

In the present preferred embodiment, third upper surface conductor 24C does not necessarily overlap third lower surface conductor 25C as seen in the direction perpendicular or substantially perpendicular to upper surface 21a of base 21. Particularly when third upper surface conductor 24C is located closer to second upper surface conductor 24B in order to further increase the area of resistive element 22, third upper surface conductor 24C may not overlap third lower surface conductor 25C as seen in the direction perpendicular or substantially perpendicular to upper surface 21a of base 21.

Then, in resistor device 20B in the present preferred embodiment, third via conductor 26C connecting third upper surface conductor 24C to third lower surface conductor 25C includes upper via conductor 26C1, lower via conductor 26C2, and inner connection conductor 26C3. This configuration enables third upper surface conductor 24C and third lower surface conductor 25C to be connected to each other even when third upper surface conductor 24C does not overlap third lower surface conductor 25C.

In this configuration, resistive element 22 of resistor device 20B is electrically connected to first and third upper surface conductors 24A and 24C of resistor device 20B, and therefore, first and third via conductors 26A and 26C connected respectively to first and third upper surface conductors 24A and 24C define and function as a relay conductor for resistive element 22 to electrically connect first and third upper surface conductors 24A and 24C to first and third lower surface conductors 25A and 25C, respectively.

Thus, first and third lower surface conductors 25A and 25C of resistor device 20A define and function as terminal conductors that are connecting terminals connecting resistor device 20B to a circuit board.

In this case, first upper surface conductor 24A and first via conductor 26A also define and function as a relay conductor for first external electrode 14A of capacitor device 10, and first lower surface conductor 25A also defines and functions as a terminal conductor that is a connecting terminal connecting capacitor device 10 to a circuit board.

Accordingly, composite electronic component 1B in the present preferred embodiment includes three terminal conductors that are connecting terminals to a circuit board, and has an equivalent circuit as shown in FIG. 15.

The above-described configuration also produces similar effects to those described above in connection with the first preferred embodiment, and enables a resistor element (R) and a capacitor element (C) having desired electrical characteristics to be easily combined. Accordingly, a higher degree of freedom in designing the composite electronic component itself as a higher degree of freedom in designing a circuit on a circuit board on which the composite electronic component is mounted are achieved.

In composite electronic component 1B, the resistor element (R) and the capacitor element (C) are not electrically connected in parallel in composite electronic component 1B. In terms of circuit design, the degree of freedom in designing a circuit is also significantly improved. Specifically, the resistor element (R) and the capacitor element (C) are electrically connected to each other on a circuit board on which composite electronic component 1B is mounted, and therefore, they can be connected either in series or in parallel. Accordingly, a composite electronic component applicable to a wide variety of circuits is achieved.

Third Preferred Embodiment

Figure 16:
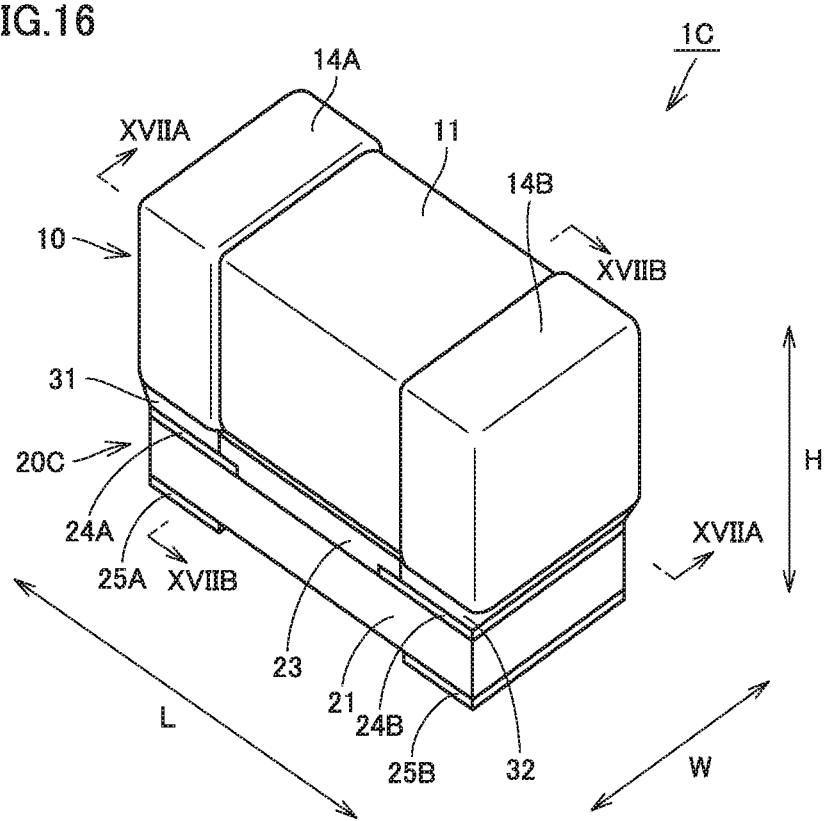
FIG. 16 is a schematic perspective view of a composite electronic component in a third preferred embodiment of the present invention.
Figure 17A:
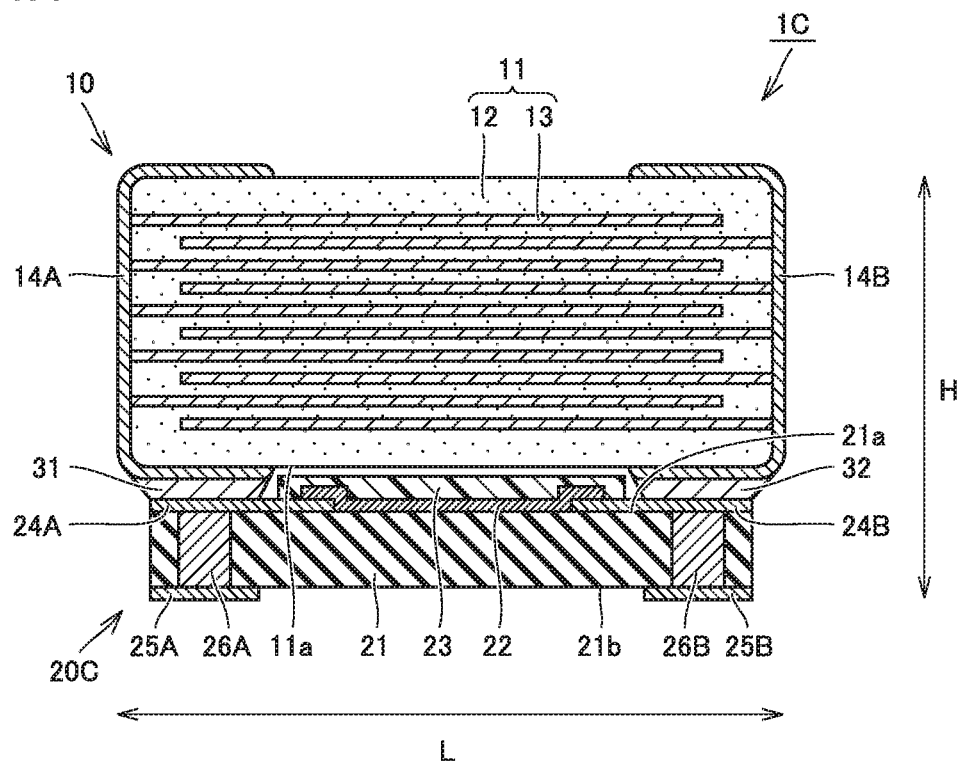
FIG. 17A is a schematic cross-sectional view along a line XVIIA-XVIIA shown in FIG. 16.
Figure 17B:
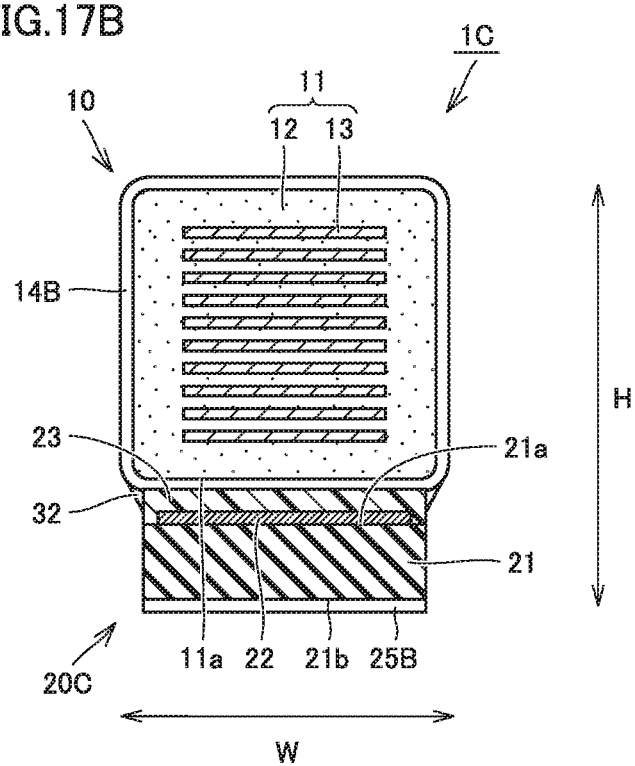
FIG. 17B is a schematic cross-sectional view along a line XVIIB-XVIIB shown in FIG. 16.

FIG. 16 is a schematic perspective view of a composite electronic component according to a third preferred embodiment of the present invention. FIG. 17A is a schematic cross-sectional view along a line XVIIA-XVIIA shown in FIG. 16. FIG. 17B is a schematic cross-sectional view along a line XVIIB-XVIIB shown in FIG. 16. FIG. 18A is a top view of a resistor device shown in FIG. 16. FIG. 18B is a bottom view of the resistor device shown in FIG. 16. FIG. 19 is a diagram showing an equivalent circuit of the composite electronic component shown in FIG. 16. Referring to FIGS. 16 to 19, a composite electronic component 1C according to the present preferred embodiment is described.

As shown in FIGS. 16 to 18, composite electronic component 1C in the present preferred embodiment differs from composite electronic component 1A in that composite electronic component 1C includes a differently configured resistor device 20C. Resistor device 20C differs from resistor device 20A primarily in that resistor device 20C does not include third and fourth upper surface conductors 24C and 24D, third and fourth lower surface conductors 25C and 25D, and third and fourth via conductors 26C and 26D. In the present preferred embodiment, the first connection conductor and the second connection conductor are each preferably defined by only a conductor located inside base 21.

Specifically, as shown in FIGS. 17A to 18B, resistor device 20C does not include another conductor on the portion between first and second upper surface conductors 24A and 24B in length direction L of upper surface 21a of base 21. Resistor device 20C also does not include another conductor on the portion between first and second lower surface conductors 25A and 25B in length direction L of lower surface 21b of base 21.

One end in length direction L of resistive element 22 covers a portion of first upper surface conductor 24A and the other end in length direction L thereof covers a portion of second upper surface conductor 24B. Accordingly, first and second upper surface conductors 24A and 24B are connected to resistive element 22.

In this case, resistive element 22 of resistor device 20C is electrically connected to first and second upper surface conductors 24A and 24B of resistor device 20C. Therefore, first and second via conductors 26A and 26B connected respectively to first and second upper surface conductors 24A and 24B define and function as a relay conductor for resistive element 22 to electrically connect first and second upper surface conductors 24A and 24B to first and second lower surface conductors 25A and 25B, respectively.

Thus, first and second lower surface conductors 25A and 25B of resistor device 20C define and function as terminal conductors that are connecting terminals connecting resistor device 20C to a circuit board.

In this case, first and second upper surface conductors 24A and 24B and first and second via conductors 26A and 26B also define and function as a relay conductor for capacitor device 10. In addition, first and second lower surface conductors 25A and 25B also define and function as terminal conductors that are connecting terminals connecting capacitor device 10 to a circuit board.

Accordingly, composite electronic component 1C in the present preferred embodiment includes two terminal conductors that are connecting terminals to a circuit board, and has an equivalent circuit as shown in FIG. 19.

The above-described configuration of the present preferred embodiment also produces similar effects to those described above in connection with the first preferred embodiment, and enables a resistor element (R) and a capacitor element (C) having desired electrical characteristics to be easily combined. A higher degree of freedom in designing the composite electronic component itself is thus achieved.

Fourth Preferred Embodiment

Figure 21:
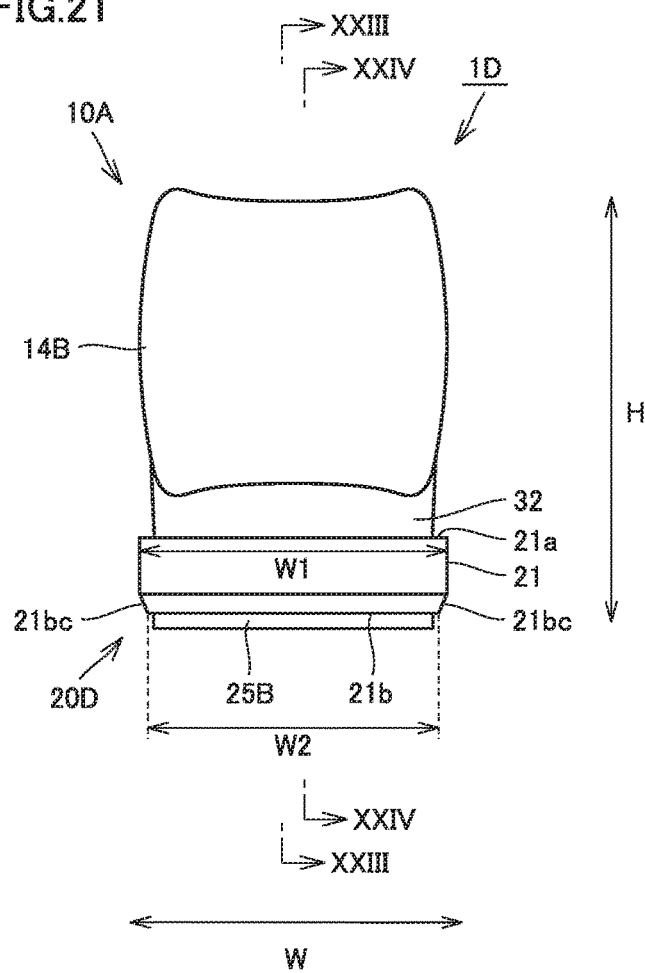
FIG. 21 is a diagram of the composite electronic component in FIG. 20 as seen in the direction indicated by an arrow XXI.
Figure 22:
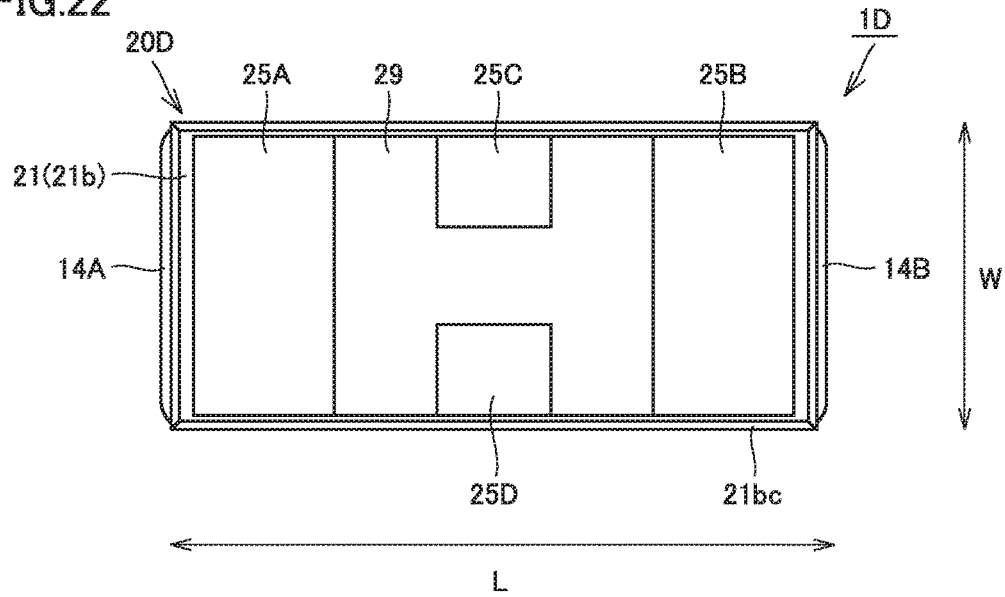
FIG. 22 is a diagram showing the composite electronic component in FIG. 20 as seen in the direction indicated by an arrow XXII.
Figure 23:
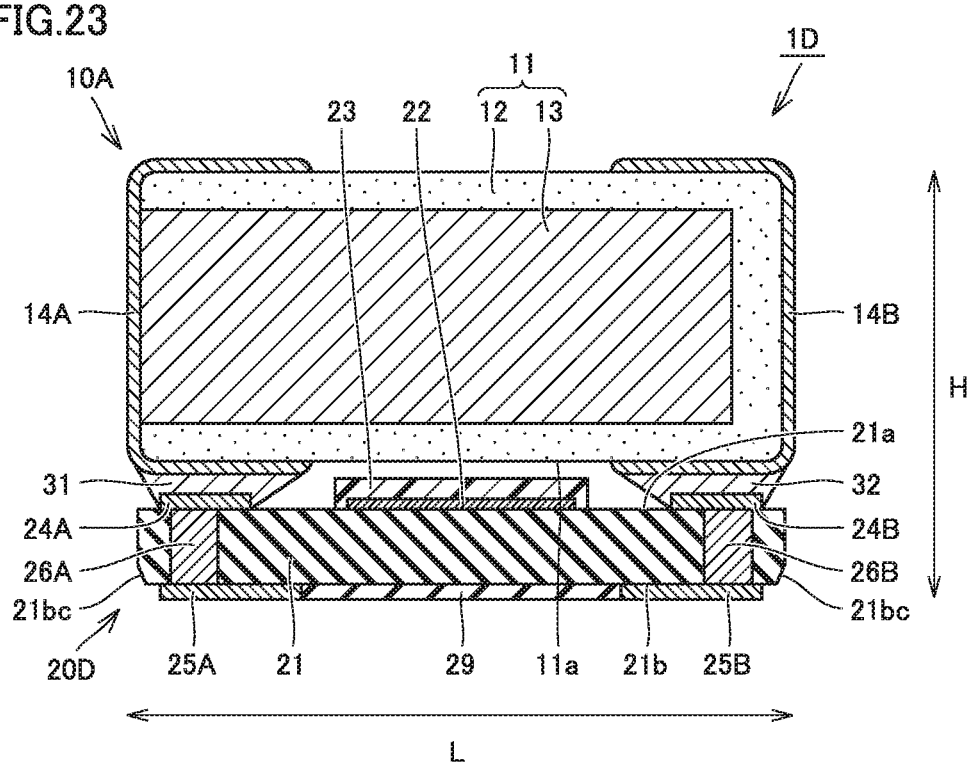
FIG. 23 is a cross-sectional view of the composite electronic component in FIG. 21 as seen in the direction indicated by an arrow XXIII-XXIII.
Figure 24:
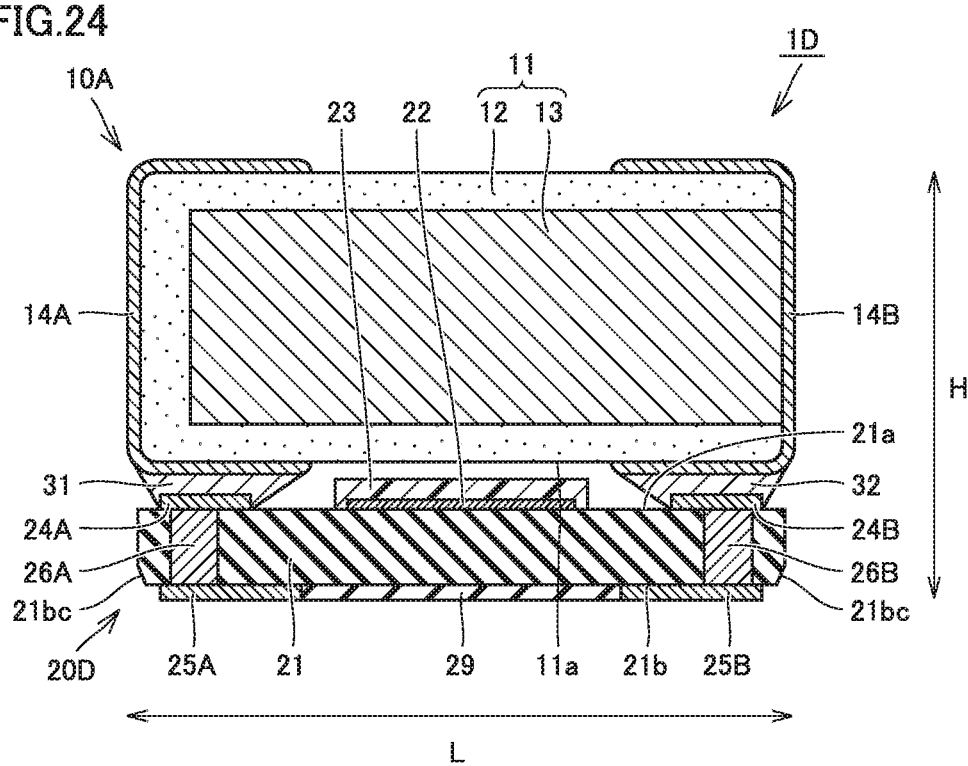
FIG. 24 is a cross-sectional view of the composite electronic component in FIG. 21 as seen in the direction indicated by an arrow XXIV-XXIV.
Figure 25:
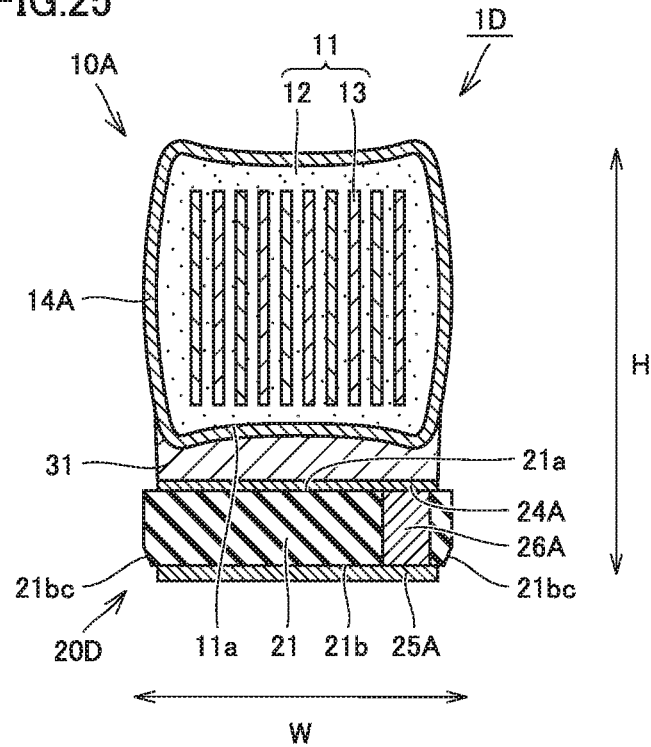
FIG. 25 is a cross-sectional view of the composite electronic component in FIG. 20 as seen in the direction indicated by an arrow XXV-XXV.
Figure 26:
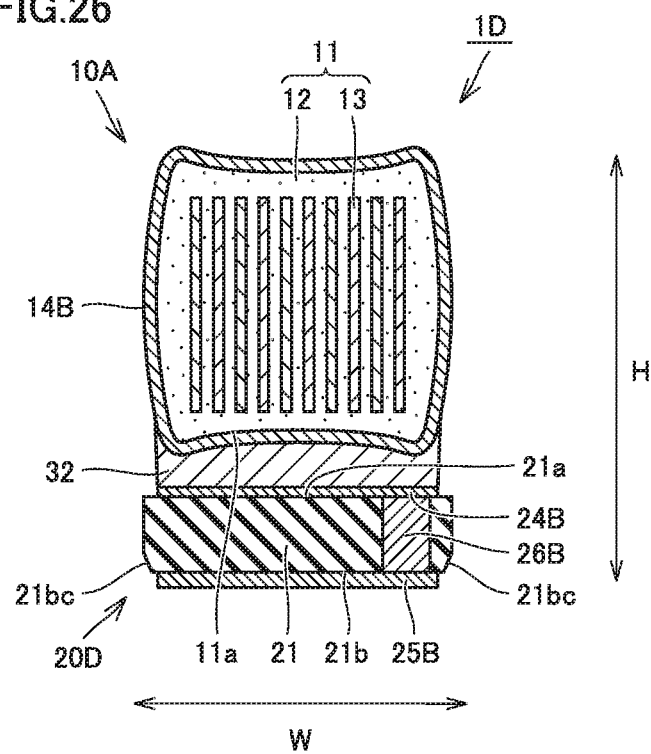
FIG. 26 is a cross-sectional view of the composite electronic component in FIG. 20 as seen in the direction indicated by an arrow XXVI-XXVI.

FIG. 20 is a side view of a composite electronic component in a fourth preferred embodiment of the present invention. FIG. 21 is a diagram of the composite electronic component in FIG. 20 as seen in the direction indicated by an arrow XXI. FIG. 22 is a diagram showing the composite electronic component in FIG. 20 as seen in the direction indicated by an arrow XXII. FIG. 23 is a cross-sectional view of the composite electronic component in FIG. 21 as seen in the direction indicated by an arrow XXIII-XXIII. FIG. 24 is a cross-sectional view of the composite electronic component in FIG. 21 as seen in the direction indicated by an arrow XXIV-XXIV. FIG. 25 is a cross-sectional view of the composite electronic component in FIG. 20 as seen in the direction indicated by an arrow XXV-XXV. FIG. 26 is a cross-sectional view of the composite electronic component in FIG. 20 as seen in the direction indicated by an arrow XXVI-XXVI. FIG. 27 is a cross-sectional view of the composite electronic component in FIG. 20 as seen in the direction indicated by an arrow XXVII-XXVII.

As shown in FIGS. 20 to 27, a composite electronic component 1D in a fourth preferred embodiment of the present invention includes a capacitor device 10A and a resistor device 20D. In the present preferred embodiment, the first and second connection conductors are each preferably defined by only a conductor located inside base 21, and third and fourth connection conductors are each preferably defined by only a conductor located inside base 21.

Capacitor body 11 of capacitor device 10A includes a plurality of internal electrode layers 13 that are stacked together. Among a plurality of internal electrode layers 13, one of a pair of internal electrode layers 13 that are adjacent to each other is electrically connected to one of first and second external electrodes 14A and 14B, and the other of the pair of internal electrode layers 13 is electrically connected to the other of first and second external electrodes 14A and 14B. The stacking direction in which a plurality of internal electrode layers 13 are stacked is perpendicular or substantially perpendicular to height direction H and parallel or substantially parallel to width direction W.

As described above, capacitor body 11 is manufactured by stacking a plurality of ceramic green sheets each including a conductive paste printed thereon, and pressing these sheets in the direction in which they are stacked together. In the resultant stack formed by pressing, the portion where internal electrode layers 13 are located differs in thickness from the portion where internal electrode layers 13 are not located. Specifically, the thickness of the portion where internal electrode layers 13 are located is larger than the thickness of the portion where internal electrode layers 13 are not located.

Consequently, as seen in length direction L, the surfaces of capacitor device 10A that cross the stack direction in which a plurality of internal electrode layers 13 are stacked are curved outward in a convex shape. Specifically, each of the side surfaces of capacitor body 11 is curved so that its center in height direction H is located outward in width direction W relative to its ends in height direction H.

In the present preferred embodiment, as seen in length direction L, the surfaces of capacitor device 10A that extend along the stack direction of a plurality of internal electrode layers 13 are curved so that respective centers are recessed inward. Specifically, each of the pair of main surfaces of capacitor body 11 is curved so that its ends in width direction W protrude outward in height direction H relative to its center in width direction W. The depth of the recess of each curved surface is preferably about 5 μm or less, for example. As seen in length direction L, the surfaces of capacitor device 10A that extend along the stacking direction of a plurality of internal electrode layers 13 are more preferably flat surfaces.

In composite electronic component 1D, first upper surface conductor 24A and first external electrode 14A are connected to each other through first joint member 31, and second upper surface conductor 24B and second external electrode 14B are connected to each other through second joint member 32. As such, first upper surface conductor 24A and first external electrode 14A are not in direct contact with each other, and second upper surface conductor 24B and second external electrode 14B are not in direct contact with each other.

Preferably, each of first joint member 31 and second joint member 32 has a thickness of about 10 μm or more, for example. Preferably, the shortest distance between lower surface 11a of capacitor body 11 and resistor device 20D in height direction H is about 20 μm or more, for example.

In the present preferred embodiment, each of first joint member 31 and second joint member 32 is made of a conductive joint material. A main component of the conductive joint material is preferably Sn (tin), for example. The conductive joint material may contain Sb (antimony) or Au (gold). Ag (silver) and Cu (copper) are preferable absent in the conductive joint material. The conductive joint material preferably has a melting point of about 237° C. or more, for example. The conductive joint material may not be used, and each of first joint member 31 and second joint member 32 may be formed by re-melted Sn plating on the surfaces of first and second upper surface conductors 24A and 24B or first and second external electrodes 14A and 14B.

In the present preferred embodiment, the edge between the outer peripheral surface and lower surface 21b of base 21 preferably is beveled. In contrast, the edge between the outer peripheral surface and upper surface 21a of base 21 preferably is not beveled. Thus, a recess 21bc is provided on the outer perimeter of lower surface 21b of base 21. As shown in FIG. 20, length L2 of lower surface 21b of base 21 is smaller than length L1 of upper surface 21a of base 21. As shown in FIG. 21, width W2 of lower surface 21b of base 21 is smaller than width W1 of upper surface 21a of base 21.

On lower surface 21b of base 21, a protective film 29 is disposed to separate first and second lower surface conductors 25A and 25B and third and fourth lower surface conductors 25C and 25D from each other. Protective film 29 is preferably made of an electrically insulating film of a glass material, a resin material, or other suitable material, for example.

Figure 28A:
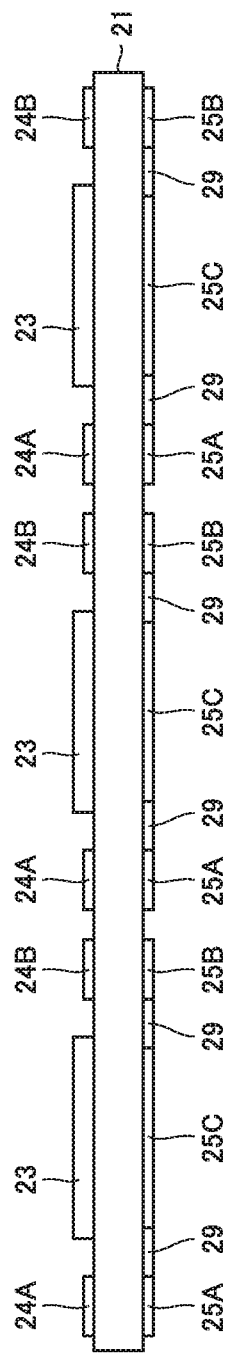
FIG. 28A is a side view of a substrate on which elements of resistor devices are provided.
Figure 28B:
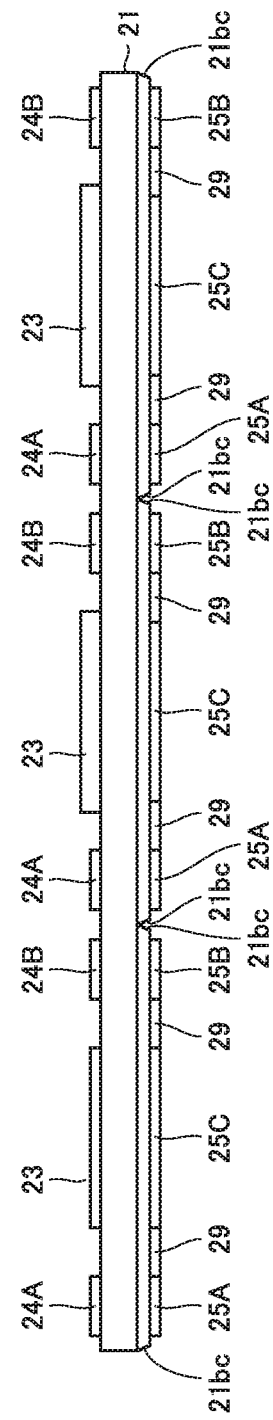
FIG. 28B is a side view of the substrate including grooves provided in one of the surfaces of the substrate by laser scribing.
Figure 28C:
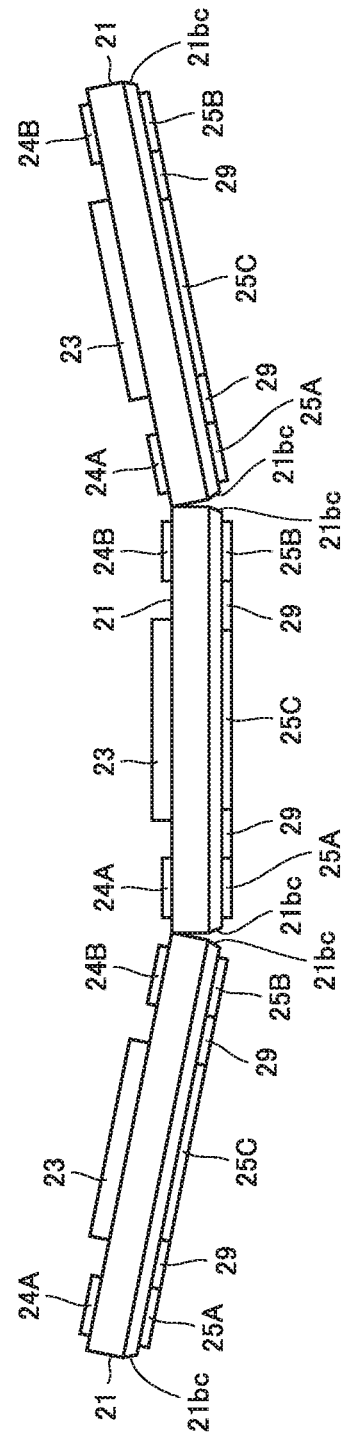
FIG. 28C is a side view of the substrate divided by being warped to extend cracks from the grooves.

A non-limiting example of a method for fabricating resistor device 20D in the present preferred embodiment is described below. FIG. 28A is a side view of a substrate on which elements of resistor devices are formed. FIG. 28B is a side view of the substrate including grooves formed in one of the surfaces of the substrate by laser scribing. FIG. 28C is a side view of the substrate divided by being warped to extend cracks from the grooves.

As shown in FIG. 28A, elements of resistor device 20D other than base 21 are disposed on a substrate that is to form base 21 to fabricate a collective body into which a plurality of resistor devices 20D are integrated. Then, as shown in FIG. 28B, grooves are formed in a lattice shape in only the lower surface of the substrate by laser scribing. The grooves form recess 21bc. Then, the substrate is divided along each of a plurality of grooves extending in one direction among the grooves of the lattice, to divide the substrate into strips.

Next, as shown in FIG. 28C, the strip-shaped substrate is divided along each of a plurality of grooves extending in the other direction among the grooves in the lattice shape, to divide the substrate into separate pieces. Resistor device 20D fabricated in this manner provides composite electronic component 1D including recess 21bc provided on only the outer perimeter of lower surface 21b of base 21 as shown in FIGS. 20 to 27.

As composite electronic component 1D includes recess 21bc, damages such as cracking and chipping of base 21 when base 21 of composite electronic component 1D contacts or bumps against another article during transport of composite electronic component 1D is reduced or prevented.

As capacitor device 10A is disposed on the upper surface of base 21, the outer perimeter of the upper surface of base 21 is less likely to contact or bump against another article during transport of composite electronic component 1D. It is, therefore, unnecessary to provide the recess on the outer perimeter of the upper surface of base 21. Accordingly, as compared with a case where recesses 21bc are provided on both of the respective outer perimeters of the upper surface and lower surface 21b of base 21, the manufacture cost of resistor device 20D is reduced. In order to make it less likely that the outer perimeter of the upper surface of base 21 contacts or bumps against another article during transport of composite electronic component 1D, the length of resistor device 20D is preferably equal to or less than the length of capacitor device 10A, and the width of resistor device 20D is preferably equal to or less than the width of capacitor device 10A.

As the grooves are formed by laser scribing, the positional precision of the contour of base 21 with respect to first to fourth lower surface conductors 25A to 25D is improved. When composite electronic component 1D is to be mounted on a circuit board, lower surface 21b of base 21 is identified and resistor device 20D is mounted on the circuit board. In this manner, first and fourth lower surface conductors 25A to 25D are arranged with high precision with respect to the lands of the circuit board. This enables reduction of the dimensions of composite electronic component 1D.

A step of mounting the composite electronic component on a circuit board by sucking the composite electronic component with a mounter is described. FIG. 29 is a cross-sectional view showing a state in which a composite electronic component in which the direction in which internal electrode layers are stacked is parallel or substantially parallel to the height direction is sucked with a nozzle of a mounter. FIG. 30 is a cross-sectional view showing a state in which a composite electronic component in the present preferred embodiment in which the direction in which internal electrode layers are stacked is perpendicular or substantially perpendicular to the height direction is sucked with a nozzle of a mounter.

As shown in FIG. 29, in the case where a plurality of internal electrode layers 13 of capacitor device 10 are stacked in the direction parallel or substantially perpendicular to the height direction H and, accordingly, each of the pair of main surfaces of capacitor body 11 is curved so that its center in width direction W is protruded outward in height direction H relative to its ends in width direction W, a gap is likely to be generated between the forward end of a nozzle 90 of the mounter and the main surface of capacitor body 11. Through this gap, air passes as indicated by an arrow 91, resulting in a decrease in the suction force of the mounter. If the mounter is moved in this state, the acceleration applied by operation of the mounter may cause the composite electronic component to swing and the composite electronic component may be held in an inclined state by the mounter as shown in FIG. 20. If the composite electronic component held in such a state is mounted on a circuit board, the precision with which the composite electronic component is positioned with respect to the circuit board is reduced and the obliquely inclined composite electronic component is mounted on the circuit board.

This phenomenon may also occur when capacitor device 10 is mounted on resistor device 20D. If this phenomenon occurs when capacitor device 10 is mounted on resistor device 20D, the precision with which capacitor device 10 is positioned with respect to resistor device 20D is reduced and obliquely inclined capacitor device 10 is mounted on resistor device 20D.

In composite electronic component 1D in the present preferred embodiment, the direction in which a plurality of internal electrode layers 13 of capacitor device 10A are stacked is preferably perpendicular or substantially perpendicular to height direction H as shown in FIG. 30, and therefore, each of the pair of main surfaces of capacitor body 11 is curved so that its ends in width direction W protrude outward in height direction H relative to its center in width direction W. In this case, the forward end of nozzle 90 of the mounter is easily brought into close contact with the main surface of capacitor body 11. Therefore, the suction force of the mounter is stably maintained high and the composite electronic component is held in a stable posture without being inclined. When composite electronic component 1D is mounted on a circuit board, composite electronic component 1D is positioned with respect to the circuit board with high precision and composite electronic component 1D is mounted on the circuit board in a stable posture without being inclined.

Similarly, regarding composite electronic component 1D in the present preferred embodiment, when capacitor device 10A is mounted on resistor device 20D, capacitor device 10A is positioned with respect to resistor device 20D with high precision and capacitor device 10A is mounted on resistor device 20D in a stable posture without being inclined.

In composite electronic component 1D in the present preferred embodiment, no conductor is disposed on the outer peripheral surface of base 21 of resistor device 20D. Therefore, when composite electronic component 1D is mounted on a circuit board with a solder, the solder is prevented from flowing on the outer peripheral surface of base 21. Consequently, a short circuit, due to the solder used to mount composite electronic component 1D on the circuit board, between composite electronic component 1D and an electronic component mounted in the vicinity of composite electronic component 1D is prevented. Moreover, reduction of the distance between electronic components mounted on the circuit board and, accordingly, downsizing of the circuit board are achieved.

Regarding composite electronic component 1D in the present preferred embodiment, the melting point of a conductive joint material defining each of first and second joint members 31 and 32 is preferably higher than the melting point of a solder used for mounting composite electronic component 1D on a circuit board. Therefore, when composite electronic component 1D is mounted on the circuit board, each of first and second joint members 31 and 32 is less likely to be re-melted. Consequently, positional displacement of resistor device 20D and capacitor device 10A relative to each other is less likely to occur, and a short circuit between composite electronic component 1D and an electronic component disposed in the vicinity of composite electronic component 1D is prevented. Moreover, the occurrence of solder flash is prevented.

Solder flash is a phenomenon as follows. When elements joined together by a solder are sealed by a resin and the solder is heated again to a temperature of its melting point or higher, the solder is melted to expand and, accordingly, extend along the interface between the resin and the elements while breaking the interface.

In composite electronic component 1D in the present preferred embodiment, first upper surface conductor 24A is not in direct contact with first external electrode 14A and second upper surface conductor 24B is not in direct contact with second external electrode 14B. An adequate thickness of each of first and second joint members 31 and 32 is thus ensured. Consequently, in each of first and second joint members 31 and 32, the occurrence of voids in the conductive joint material is prevented and an adequate strength of the joint between resistor device 20D and capacitor device 10A is stably ensured.

Between lower surface 11a of capacitor body 11 and resistor device 20D, an adequate space in height direction H is ensured. This enables a cleaning fluid to easily enter the space between lower surface 11a of capacitor body 11 and resistor device 20D and reliably remove flux residue. When a visual inspection of the joint between resistor device 20D and capacitor device 10A is conducted, the space in height direction H between lower surface 11a of capacitor body 11 and resistor device 20D facilitates visual recognition and evaluation of the joint between first upper surface conductor 24A and first external electrode 14A and the joint between second upper surface conductor 24B and second external electrode 14B.

Fifth Preferred Embodiment

A composite electronic component in a fifth preferred embodiment of the present invention is described below. A composite electronic component 1E in the present preferred embodiment differs from composite electronic component 1D in the fourth preferred embodiment in terms of the configuration of the first and second external electrodes and a resin film disposed on the surface of the first and second joint members. Features similar to those of composite electronic component 1D in the fourth preferred embodiment are therefore not repeated.

Figure 31:
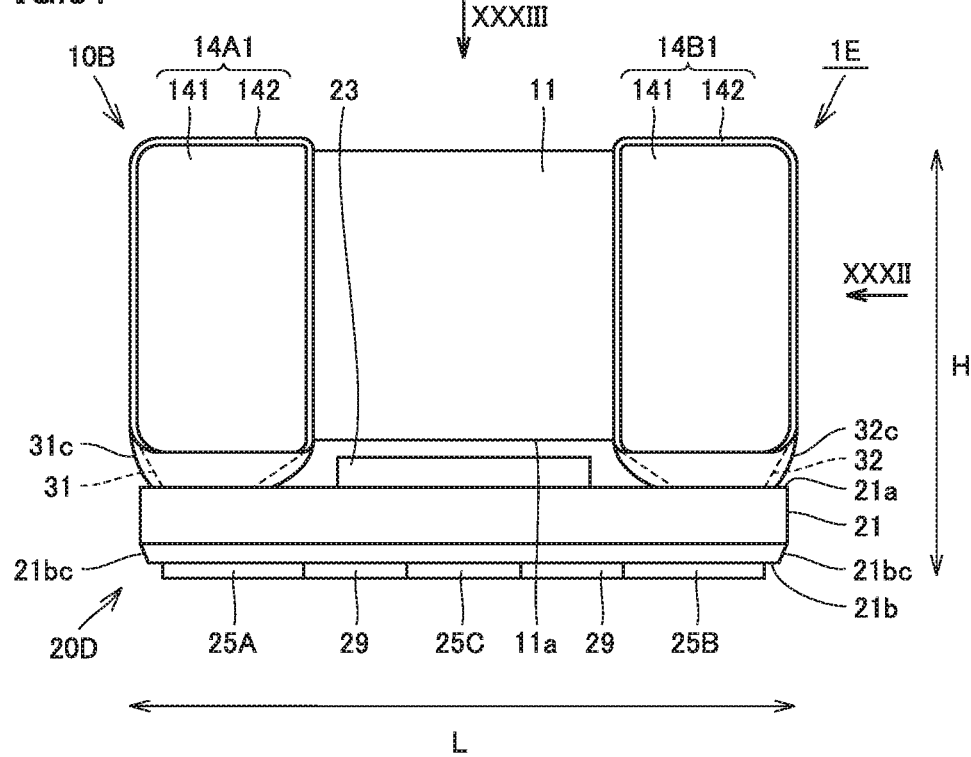
FIG. 31 is a side view of a composite electronic component in a fifth preferred embodiment of the present invention.
Figure 32:
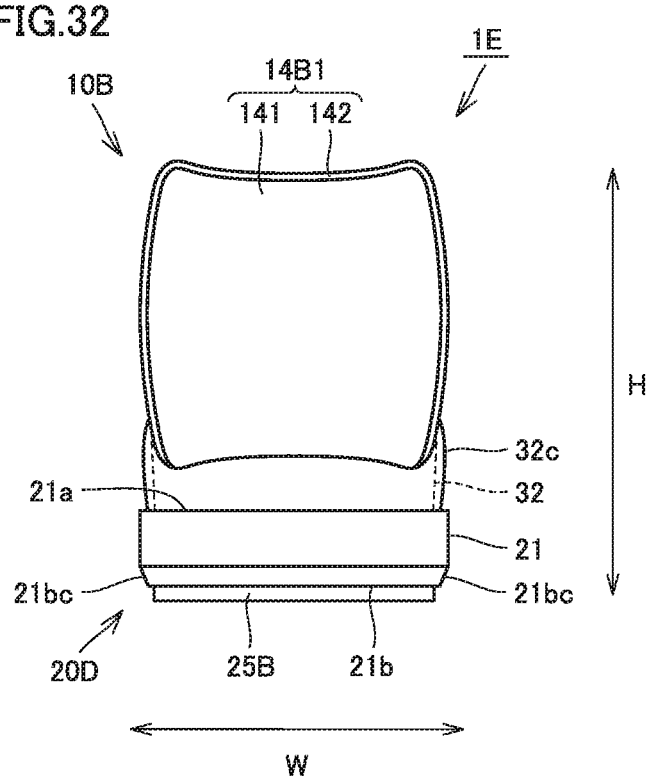
FIG. 32 is a diagram of the composite electronic component in FIG. 31 as seen in the direction of an arrow XXXII.
Figure 33:
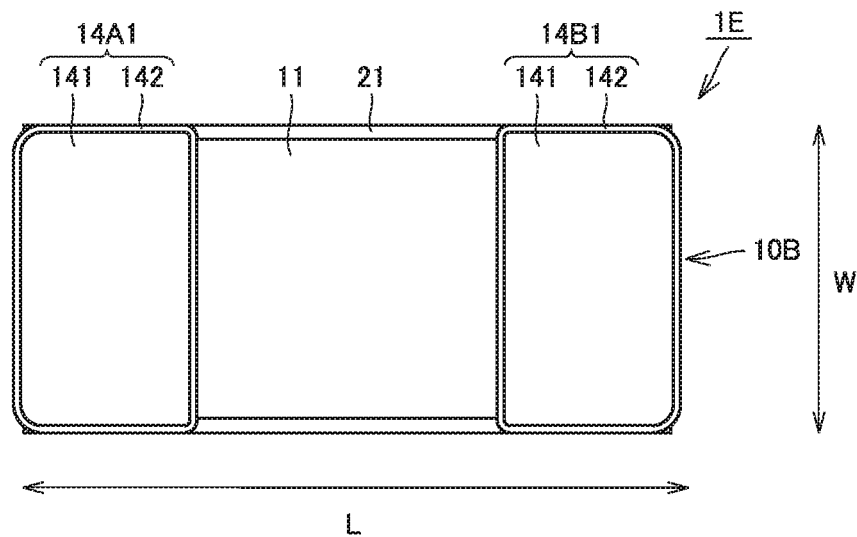
FIG. 33 is a diagram of the composite electronic component in FIG. 31 as seen in the direction of an arrow XXXIII.

FIG. 31 is a side view of a composite electronic component in the fifth preferred embodiment of the present invention. FIG. 32 is a diagram of the composite electronic component in FIG. 31 as seen in the direction of an arrow XXXII. FIG. 33 is a diagram of the composite electronic component in FIG. 31 as seen in the direction of an arrow XXXIII.

As shown in FIGS. 31 to 33, composite electronic component 1E in the fifth preferred embodiment of the present invention includes a capacitor device 10B and a resistor device 20D. A first external electrode 14A1 and a second external electrode 14B1 of capacitor device 10B each preferably include an Sn (tin) plating layer 141 and an Sn—Ni (nickel) layer 142 covered by Sn plating layer 141 and containing an intermetallic compound of Sn and Ni, for example.

Specifically, first external electrode 14A1 and second external electrode 14B1 each includes, in order from the outer one, Sn plating layer 141, Sn—Ni layer 142, and an Ni plating layer (not shown). Sn—Ni layer 142 is formed by alloying of Sn in Sn plating layer 141 and Ni in the Ni plating layer.

Sn—Ni layer 142 is exposed from at least a portion of each of first external electrode 14A1 and second external electrode 14B1. In the present preferred embodiment, Sn—Ni layer 142 is preferably exposed from the vertices and edges of each of first external electrode 14A1 and second external electrode 14B1. On the exposed surface of Sn—Ni layer 142, an oxide coating is formed due to contact with the air. The oxide coating on Sn—Ni layer 142 has a property that makes the material of first joint member 31 and second joint member 32 less likely to adhere to the oxide film and has an electrical insulation property.

As to the method for exposing Sn—Ni layer 142, the portions of first and second external electrodes 14A1 and 14B1 at which Sn—Ni layer 142 is not exposed are masked. Masked capacitor device 10B is immersed in a stripping solution. As the stripping solution, ENSTRIP®, for example, that selectively dissolves Sn may preferably be used.

The portion of each of first and second external electrodes 14A1 and 14B1 at which Sn—Ni layer 142 is exposed is not limited to the vertices and edges, and the entirety of the portion covering the side surfaces and the top surface of capacitor body 11 may include the exposed Sn—Ni layer 142, for example. In this case, Sn plating layer 141 is located in only the surface of the portion of each of first and second external electrodes 14A1 and 14B1 that covers lower surface 11a of capacitor body 11.

In composite electronic component 1E in the fifth preferred embodiment of the present invention, resin films 31c and 32c each extending continuously on capacitor device 10B and resistor device 20D cover at least a portion of the surfaces of first and second joint members 31 and 32. In the present preferred embodiment, resin film 31c preferably covers the entire surface of first joint member 31, and resin film 32c covers the entire surface of second joint member 32. Resin films 31c and 32c may fill a gap between capacitor device 10B and resistor device 20D.

Resin films 31c and 32c are each preferably made of epoxy resin, urethane resin or other suitable resin containing hardener and/or inorganic filler, for example. The heatproof temperature of resin films 31c and 32c is higher than the melting point of the material forming first and second joint members 31 and 32.

When capacitor device 10B is joined to resistor device 20D, Sn melted from Sn plating layer 141 flows onto the end surfaces of capacitor body 11 due to surface tension, causing a phenomenon of increasing the length of capacitor device 10B. In composite electronic component 1E in the fifth preferred embodiment, Sn plating layer 141 is partially removed from each of first and second external electrodes 14A1 and 14B1, which makes it less likely that the phenomenon of increasing the length of capacitor device 10B occurs.

Sn—Ni layer 142 is exposed from the vertices and edges of each of first and second external electrodes 14A1 and 14B1, and therefore, even when at least one of first and second external electrodes 14A1 and 14B1 of composite electronic component 1E is brought into contact with an adjacent electronic component, at the position where Sn—Ni layer 142 is exposed, the electrical insulation property of Sn—Ni layer 142 prevents a short circuit between this electronic component and composite electronic component 1E.

Regarding composite electronic component 1E in the fifth preferred embodiment, the phenomenon of increasing the length of capacitor device 10B is less likely to occur and occurrence of a short circuit between composite electronic component 1E and an adjacent electronic component is prevented as described above, which enables electronic components to be integrated on a circuit board at a high density.

In composite electronic component 1E in the fifth preferred embodiment, resin films 31c and 32c extending continuously on capacitor device 10B and resistor device 20D is disposed on first and second joint members 31 and 32. Accordingly, the area of the joint between capacitor device 10B and resistor device 20D is increased, and consequently the strength of the joint between capacitor device 10B and resistor device 20D is increased.

The heatproof temperature of resin films 31c and 32c is higher than the melting point of the material forming first and second joint members 31 and 32. Therefore, when composite electronic component 1E is mounted on a circuit board and first and second joint members 31 and 32 are each re-melted, positional displacement of resistor device 20D and capacitor device 10B relative to each other is less likely to occur.

In the present preferred embodiment, preferably, resin film 31c covers the entire surface of first joint member 31 and resin film 32c covers the entire surface of second joint member 32. Therefore, when first and second joint members 31 and 32 are each formed by a solder, flow of the re-melted solder is blocked by resin films 31c and 32c and the occurrence of solder flash is prevented.

Sixth Preferred Embodiment

A composite electronic component in a sixth preferred embodiment of the present invention is described below. A composite electronic component 1F in the present preferred embodiment differs from composite electronic component 1D in the fourth preferred embodiment in that the width of first and second external electrodes is preferably smaller than the width of the capacitor body. Features similar to those of composite electronic component 1D in the fourth preferred embodiment are therefore not repeated.

Figure 34:
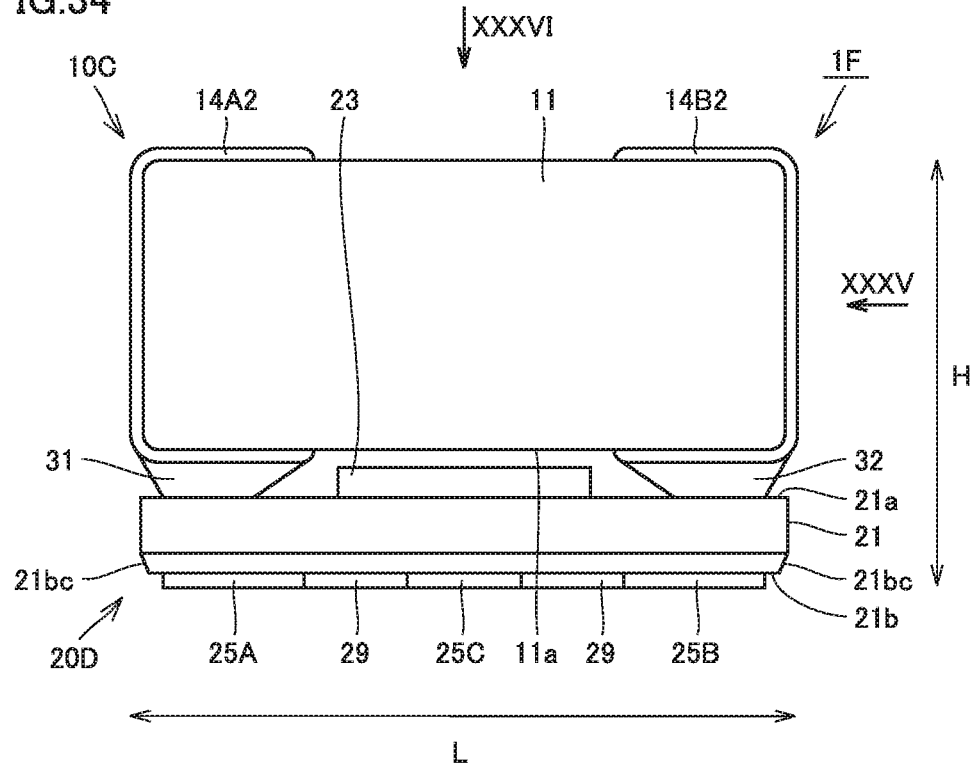
FIG. 34 is a side view of a composite electronic component in a sixth preferred embodiment of the present invention.
Figure 35:
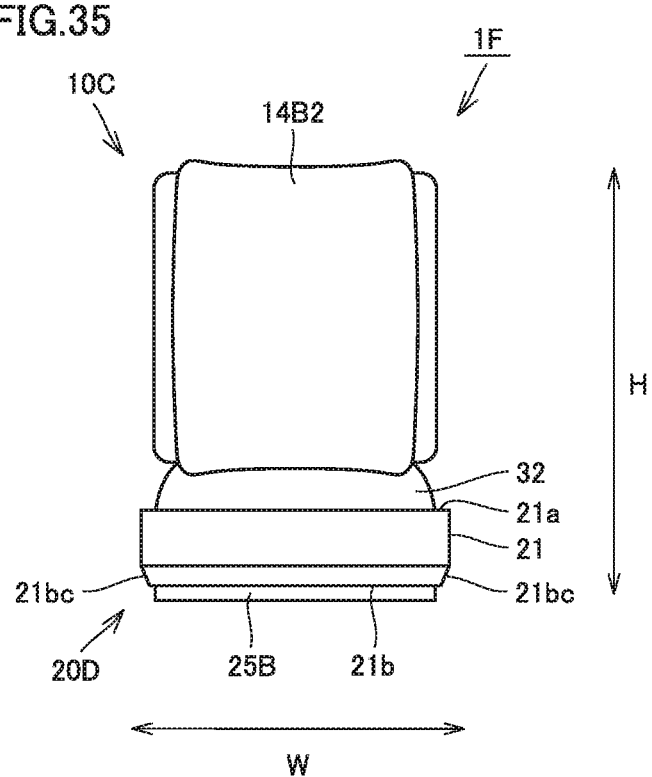
FIG. 35 is a diagram of the composite electronic component in FIG. 34 as seen in the direction indicated by an arrow XXXV.
Figure 36:
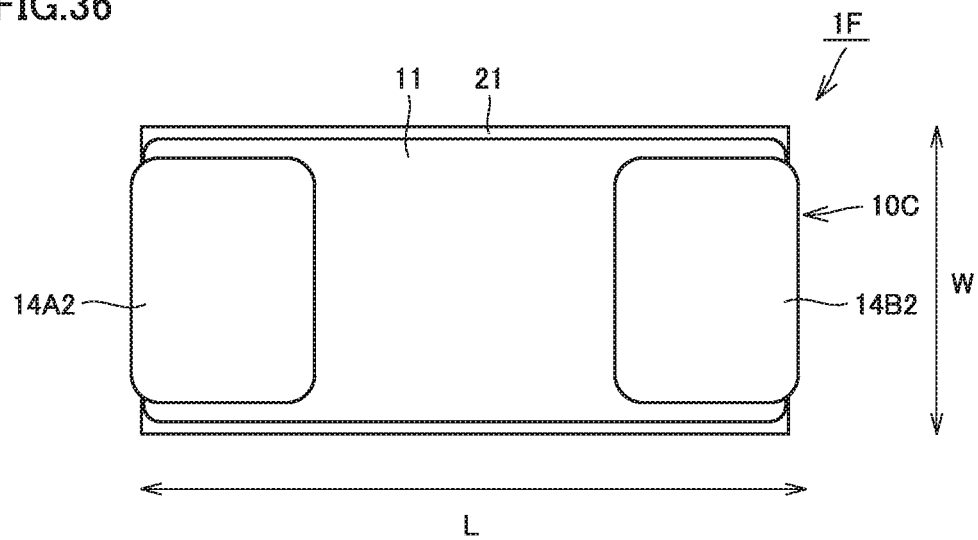
FIG. 36 is a diagram of the composite electronic component in FIG. 34 as seen in the direction indicated by an arrow XXXVI.

FIG. 34 is a side view of a composite electronic component in the sixth preferred embodiment of the present invention. FIG. 35 is a diagram of the composite electronic component in FIG. 34 as seen in the direction indicated by an arrow XXXV. FIG. 36 is a diagram of the composite electronic component in FIG. 34 as seen in the direction indicated by an arrow XXXVI.

As shown in FIGS. 34 to 36, composite electronic component 1F in the sixth preferred embodiment includes a capacitor device 10C and a resistor device 20D. The width of each of first and second external electrodes 14A2 and 14B2 of capacitor device 10C is smaller than the width of capacitor body 11.

First external electrode 14A2 is disposed continuously on one end surface of capacitor body 11 and a portion of each of the pair of main surfaces of capacitor body 11. Second external electrode 14B2 is disposed continuously on the other end surface of capacitor body 11 and a portion of each of the pair of main surfaces of capacitor body 11. The manner of disposing first and second external electrodes 14A2 and 14B2, however, is not limited to this. First external electrode 14A2 may be disposed continuously on one end surface and a portion of lower surface 11a of capacitor body 11, or disposed on only a portion of lower surface 11a. Second external electrode 14B2 may be disposed continuously on the other end surface and a portion of lower surface 11a of capacitor body 11, or disposed on only a portion of lower surface 11a.

Regarding composite electronic component 1F in the sixth preferred embodiment, the width of each of first and second external electrodes 14A2 and 14B2 is smaller than the width of capacitor body 11. Therefore, even when composite electronic component 1F is brought into contact with an adjacent electronic component, at the position of the side surface of capacitor body 11 where first and second external electrodes 14A2 and 14B2 of capacitor device 10C are absent, a short circuit between the electronic component and composite electronic component 1F is prevented.

In composite electronic components 1A to 1F in the first to sixth preferred embodiments, the width of the resistor device may be larger than the width of the capacitor device. The length of the resistor device may be larger than the length of the capacitor device.

Figure 37:
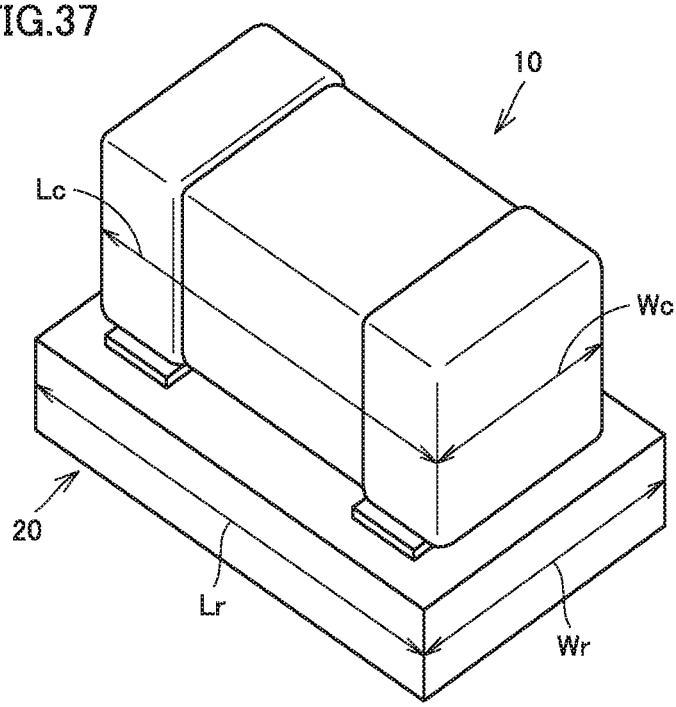
FIG. 37 is a perspective view showing a composite electronic component in which a resistor device is larger in width than a capacitor device and larger in length than the capacitor device.
Figure 38:
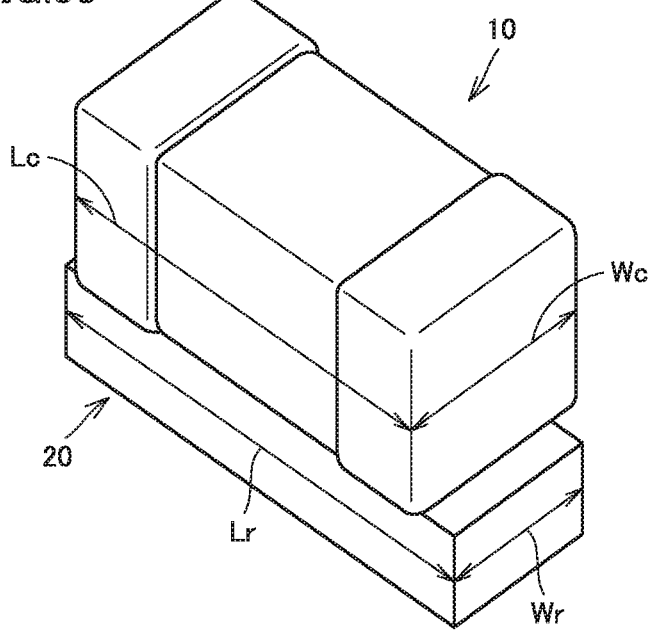
FIG. 38 is a perspective view showing a composite electronic component in which a resistor device is smaller in width than a capacitor device and larger in length than the capacitor device.
Figure 39:
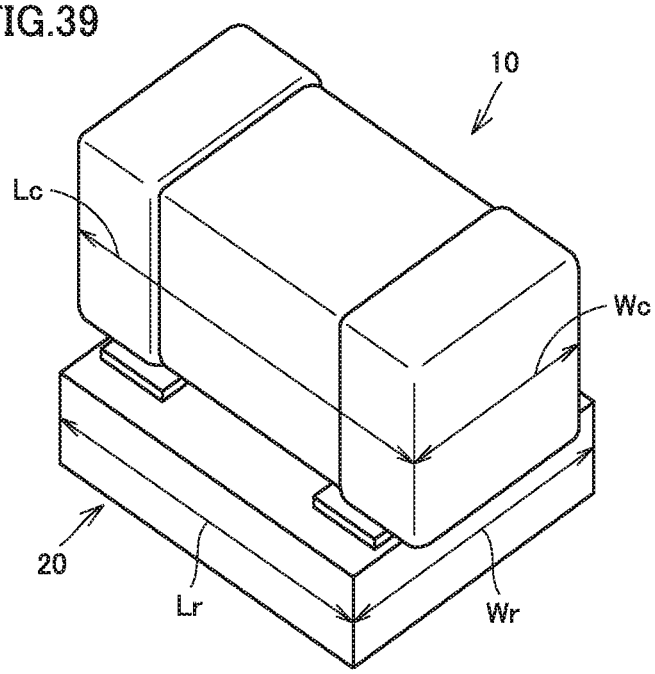
FIG. 39 is a perspective view showing a composite electronic component in which a resistor device is larger in width than a capacitor device and smaller in length than the capacitor device.

FIG. 37 is a perspective view showing a composite electronic component in which a resistor device is larger in width than a capacitor device and larger in length than the capacitor device. FIG. 38 is a perspective view showing a composite electronic component in which a resistor device is smaller in width than a capacitor device and larger in length than the capacitor device. FIG. 39 is a perspective view showing a composite electronic component in which a resistor device is larger in width than a capacitor device and smaller in length than the capacitor device.

In composite electronic components 1A to 1F in the first to sixth preferred embodiments, width Wr of resistor device 20 may be larger than width Wc of capacitor device 10 and length Lr of resistor device 20 may be larger than length Lc of capacitor device 10, as shown in FIG. 37. Alternatively, in composite electronic components 1A to 1F, width Wr of resistor device 20 may be smaller than width Wc of capacitor device 10 and length Lr of resistor device 20 may be longer than length Lc of capacitor device 10, as shown in FIG. 38. Alternatively, in composite electronic components 1A to 1F, width Wr of resistor device 20 may be larger than width Wc of capacitor device 10 and length Lr of resistor device 20 may be smaller than length Lc of capacitor device 10, as shown in FIG. 39.

Figure 40:
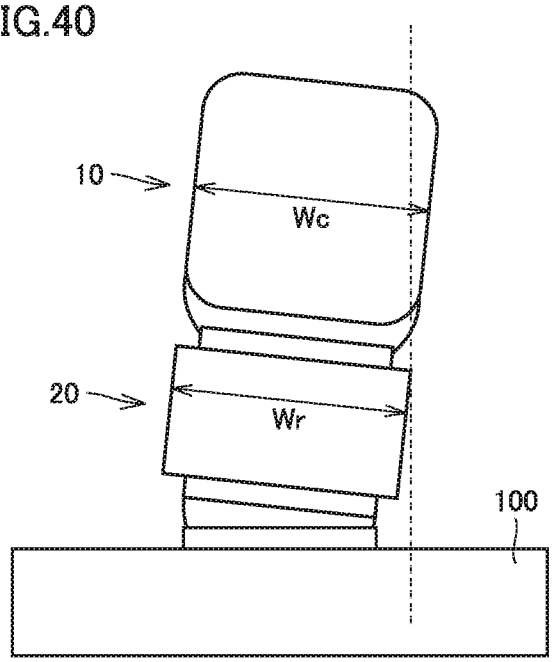
FIG. 40 is a side view showing a state where a composite electronic component in which a resistor device is equal in width to a capacitor device is mounted in an inclined posture on a circuit board.

FIG. 40 is a side view showing a state where a composite electronic component in which a resistor device is equal in width to a capacitor device is mounted in an inclined posture on a circuit board. FIG. 41 is a side view showing a state where a composite electronic component in which a resistor device is larger in width than a capacitor device is mounted in an inclined posture on a circuit board.

As shown in FIG. 40, when width Wr of resistor device 20 is equal to or less than width Wc of capacitor device 10 and the composite electronic component is mounted in an inclined posture on circuit board 100 as seen in length direction L, capacitor device 10 is partially located outside the region in width direction W in which resistor device 20 is located. As such, there is a possibility that an adjacently disposed electronic component and capacitor device 10 are brought into contact with each other and short-circuited.

As shown in FIG. 41, when width Wr of resistor device 20 is larger than width Wc of capacitor device 10 and the composite electronic component is mounted in an inclined posture on circuit board 100 as seen in length direction L, capacitor device 10 is less likely to be located outside the region in width direction W in which resistor device 20 is located. As such, the possibility that an adjacently disposed electronic component and capacitor device 10 are brought into contact with each other and short-circuited is reduced.

Likewise, when length Lr of resistor device 20 is equal to or less than length Lc of capacitor device 10 and the composite electronic component in an inclined posture is mounted on circuit board 100 as seen in width direction W, capacitor device 10 is partially located outside the region in length direction L in which resistor device 20 is located. As such, there is a possibility that an adjacently disposed electronic component and capacitor device 10 are brought into contact with each other and short-circuited.

When length Lr of resistor device 20 is larger than length Lc of capacitor device 10 and the composite electronic component is mounted in an inclined posture on circuit board 100 as seen in width direction W, capacitor device 10 is less likely to be located outside the region in length direction L in which resistor device 20 is located. As such, the possibility that an adjacently disposed electronic component and capacitor device 10 are brought into contact with each other and short-circuited is reduced.

Thus, width Wr of resistor device 20 larger than width Wc of capacitor device 10 or length Lr of resistor device 20 larger than length Lc of capacitor device 10 enables reduction of the distance between electronic components mounted on circuit board 100 and, therefore, enables downsizing of circuit board 100.

Regarding the preferred embodiments and their modifications of the present invention described above, use of a multilayer ceramic capacitor as a capacitor device to be incorporated in the composite electronic component is described by way of example. Alternatively, any of other types of the capacitor devices may be incorporated in the composite electronic component, instead of the multilayer ceramic capacitor.

Moreover, regarding the preferred embodiments and their modifications of the present invention described above, use of a multilayer ceramic capacitor as an electronic component to be mounted on the resistor device is described by way of example. The electronic component to be mounted on the resistor device may be any capacitor device other than the multilayer ceramic capacitor, and may be any of other electronic components, such as an inductor device, a thermistor device, a piezoelectric device, and other suitable devices, for example. The inductor device as compared with the multilayer ceramic capacitor includes a coil-shaped conductor layer instead of the internal electrode layer and a pair of external terminals for the coil-shaped conductor layer is disposed on the surface of the body instead of the pair of external electrodes.

Further, respective characteristic features illustrated in connection with the preferred embodiments and their modifications of the present invention may be combined in any way without going beyond the intended scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A composite electronic component comprising:
a resistor device; and
a capacitor device mounted on the resistor device in a height direction; wherein
the resistor device includes:
an electrically insulating base including an upper surface and a lower surface opposite to each other in the height direction;
a resistive element disposed on the base;
a first upper surface conductor and a second upper surface conductor disposed on the upper surface of the base and separated from each other in a length direction perpendicular or substantially perpendicular to the height direction;
a first lower surface conductor and a second lower surface conductor disposed on the lower surface of the base and separated from each other in the length direction;
a first connection conductor connecting the first upper surface conductor to the first lower surface conductor; and
a second connection conductor connecting the second upper surface conductor to the second lower surface conductor;
the capacitor device including:
a capacitor body including a lower surface crossing the height direction; and
a first external electrode and a second external electrode disposed on an outer surface of the capacitor body and separated from each other in the length direction; wherein
the upper surface of the base faces the lower surface of the capacitor body in the height direction, the first upper surface conductor is electrically connected to the first external electrode, and the second upper surface conductor is electrically connected to the second external electrode; and
the first connection conductor and the second connection conductor are each defined by only a conductor located inside the base.

2. The composite electronic component according to claim 1, wherein
the resistive element is disposed on the upper surface of the base and located between the first upper surface conductor and the second upper surface conductor in the length direction;
the resistor device further includes:
a third upper surface conductor and a fourth upper surface conductor disposed on the upper surface of the base, located between the first upper surface conductor and the second upper surface conductor in the length direction, and separated from each other;
a third lower surface conductor and a fourth lower surface conductor disposed on the lower surface of the base, located between the first lower surface conductor and the second lower surface conductor in the length direction, and separated from each other;

a third connection conductor connecting the third upper surface conductor to the third lower surface conductor; and a fourth connection conductor connecting the fourth upper surface conductor to the fourth lower surface conductor;

the third upper surface conductor and the fourth upper surface conductor are connected to the resistive element; and the third connection conductor and the fourth connection conductor are each defined by only a conductor located inside the base.

3. The composite electronic component according to claim 2, wherein the third upper surface conductor and the fourth upper surface conductor are separated from each other in a width direction perpendicular or substantially perpendicular to the height direction and to the length direction.

4. The composite electronic component according to claim 2, wherein the third upper surface conductor and the fourth upper surface conductor are separated from each other in the length direction.

5. The composite electronic component according to claim 2, wherein at least one of the third connection conductor and the fourth connection conductor includes:
an inner connection conductor extending inside the base in a direction perpendicular or substantially perpendicular to the height direction;
an upper via conductor connecting to the inner connection conductor, located between the upper surface of the base and the inner connection conductor, and extending in the height direction; and
a lower via conductor connecting to the inner connection conductor, located between the lower surface of the base and the inner connection conductor, and extending in the height direction; and
the upper via conductor and the lower via conductor do not overlap each other, as seen in the height direction.

6. The composite electronic component according to claim 2, wherein the resistor device further includes a protective film covering the resistive element.

7. The composite electronic component according to claim 6, wherein a maximum height of the protective film from the upper surface of the base is larger than respective maximum heights of the first upper surface conductor and the second upper surface conductor from the upper surface of the base.

8. The composite electronic component according to claim 1, wherein the resistive element is disposed on the upper surface of the base; and
the resistor device further includes:
a third upper surface conductor disposed on the upper surface of the base, and located between the first upper surface conductor and the second upper surface conductor in the length direction;
a third lower surface conductor disposed on the lower surface of the base, and located between the first lower surface conductor and the second lower surface conductor in the length direction; and
a third connection conductor connecting the third upper surface conductor to the third lower surface conductor;
the first upper surface conductor and the third upper surface conductor are connected to the resistive element; and the third connection conductor is defined by only a conductor located inside the base.

9. The composite electronic component according to claim 8, wherein the third connection conductor includes:
an inner connection conductor extending inside the base in a direction perpendicular or substantially perpendicular to the height direction;
an upper via conductor connecting to the inner connection conductor, located between the upper surface of the base and the inner connection conductor, and extending in the height direction; and
a lower via conductor connecting to the inner connection conductor, located between the lower surface of the base and the inner connection conductor, and extending in the height direction; and
the upper via conductor and the lower via conductor do not overlap each other, as seen in the height direction.

10. The composite electronic component according to claim 1, wherein the resistive element is disposed on the upper surface of the base; and
the first upper surface conductor and the second upper surface conductor are connected to the resistive element.

11. The composite electronic component according to claim 1, wherein the resistive element is disposed on the lower surface of the base and located between the first lower surface conductor and the second lower surface conductor in the length direction;
the resistor device further includes a third lower surface conductor and a fourth lower surface conductor disposed on the lower surface of the base, located between the first lower surface conductor and the second lower surface conductor in the length direction, and separated from each other; and
the third lower surface conductor and the fourth lower surface conductor are connected to the resistive element.

12. The composite electronic component according to claim 11, wherein the third lower surface conductor and the fourth lower surface conductor are separated from each other in a width direction perpendicular to the height direction and to the length direction.

13. The composite electronic component according to claim 11, wherein the resistor device further includes a protective film covering the resistive element.

14. The composite electronic component according to claim 1, wherein the resistive element is disposed on the lower surface of the base;
the resistor device further includes a third lower surface conductor disposed on the lower surface of the base and located between the first lower surface conductor and the second lower surface conductor in the length direction; and
the first lower surface conductor and the third lower surface conductor are connected to the resistive element.

15. The composite electronic component according to claim 1, wherein the resistive element is disposed on the lower surface of the base; and
the first lower surface conductor and the second lower surface conductor are connected to the resistive element.

16. The composite electronic component according to claim 1, wherein
- the capacitor body includes a plurality of internal electrode layers that are stacked together;
- one of a pair of internal electrode layers adjacent to each other among the plurality of internal electrode layers is electrically connected to one of the first external electrode and the second external electrode and another of the pair of internal electrode layers is electrically connected to the another of the first external electrode and the second external electrode; and
- a direction in which the plurality of internal electrode layers are stacked together is perpendicular or substantially perpendicular to the height direction.

17. The composite electronic component according to claim 1, wherein
- the first upper surface conductor and the first external electrode are connected to each other through a first joint member;
- the second upper surface conductor and the second external electrode are connected to each other through a second joint member; and
- the first joint member and the second joint member are each made of a conductive joint material.

18. The composite electronic component according to claim 17, wherein the conductive joint material contains Sn and Sb or contains Sn and Au.

19. The composite electronic component according to claim 17, wherein Ag and Cu are absent in the conductive joint material.

20. The composite electronic component according to claim 17, wherein the conductive joint material has a melting point of about 237° C. or more.

21. The composite electronic component according to claim 17, wherein a resin film extending continuously on the capacitor device and the resistor device covers at least a portion of a surface of each of the first joint member and the second joint member.

22. The composite electronic component according to claim 21, wherein the resin film covers an entire surface of each of the first joint member and the second joint member.

23. The composite electronic component according to claim 1, wherein
- the first external electrode and the second external electrode each include an Sn plating layer and an Sn—Ni layer covered by the Sn plating layer and containing an intermetallic compound of Sn and Ni; and
- the Sn—Ni layer is exposed from at least a portion of each of the first external electrode and the second external electrode.

24. The composite electronic component according to claim 23, wherein the Sn—Ni layer is exposed from vertices and edges of each of the first external electrode and the second external electrode.

25. The composite electronic component according to claim 1, wherein the first external electrode and the second external electrode are each smaller in width than the capacitor body.

26. The composite electronic component according to claim 1, wherein the resistor device is larger in width than the capacitor device.

27. The composite electronic component according to claim 1, wherein the resistor device is larger in length than the capacitor device.

28. The composite electronic component according to claim 1, wherein the lower surface of the base is smaller in width than the upper surface of the base.

29. The composite electronic component according to claim 1, wherein the lower surface of the base is smaller in length than the upper surface of the base.

* * * * *